US005940959A

United States Patent [19]

Caveney et al.

[11] Patent Number: 5,940,959

[45] Date of Patent: Aug. 24, 1999

[54] COMMUNICATION CONNECTOR WITH CAPACITOR LABEL

[75] Inventors: Jack E. Caveney, Hinsdale; Christopher J. Hayes, Indian Head Park; Joseph Rinchiuso, Melrose Park; Andrew J. Stroede, Mokena; Donald C. Wiencek, Tinley Park, all of Ill.

[73] Assignee: Panduit Corp., Tinley Park, Ill.

[21] Appl. No.: 08/639,883

[22] Filed: Apr. 26, 1996

Related U.S. Application Data

[62] Division of application No. 07/997,277, Dec. 23, 1992, Pat. No. 5,513,065.

[51] Int. Cl.[6] .................................................... H01L 17/06

[52] U.S. Cl. .......................... 29/620; 29/25.42; 361/311; 361/328; 439/607; 439/620; 439/676; 439/941

[58] Field of Search .................................. 29/620, 25.42; 361/311, 328; 439/607, 620, 676, 941

[56] References Cited

U.S. PATENT DOCUMENTS

| | | | |
|---|---|---|---|
| 3,098,955 | 7/1963 | Davis et al. . | |
| 3,743,978 | 7/1973 | Fritz . | |
| 4,126,840 | 11/1978 | Selvin . | |
| 4,342,143 | 8/1982 | Jennings | 29/620 X |
| 4,418,239 | 11/1983 | Larson et al. . | |
| 4,473,755 | 9/1984 | Imai et al. . | |
| 4,654,749 | 3/1987 | Kanai | 29/25.42 X |
| 4,678,251 | 7/1987 | Willard . | |
| 4,695,115 | 9/1987 | Talend . | |
| 4,726,638 | 2/1988 | Farrar et al. . | |
| 4,772,224 | 9/1988 | Talend . | |
| 4,797,785 | 1/1989 | Jorgensen . | |
| 4,799,901 | 1/1989 | Pirc . | |
| 4,931,754 | 6/1990 | Moussie . | |
| 5,006,822 | 4/1991 | Reddy . | |
| 5,015,204 | 5/1991 | Sakamoto et al. . | |
| 5,069,641 | 12/1991 | Sakamoto et al. . | |
| 5,118,310 | 6/1992 | Stroede et al. . | |
| 5,139,442 | 8/1992 | Sakamoto et al. . | |
| 5,178,554 | 1/1993 | Siemon et al. . | |
| 5,186,647 | 2/1993 | Denkmann et al. . | |
| 5,205,762 | 4/1993 | Carney . | |
| 5,269,705 | 12/1993 | Iannella et al. . | |
| 5,282,759 | 2/1994 | Sakamoto et al. . | |
| 5,299,956 | 4/1994 | Brownell et al. . | |
| 5,326,284 | 7/1994 | Bohbot et al. . | |
| 5,454,738 | 10/1995 | Lim et al. . | |
| 5,513,065 | 4/1996 | Caveney et al. . | |

FOREIGN PATENT DOCUMENTS

| | | |
|---|---|---|
| 2004346 | 8/1971 | Germany . |
| 2-162667 | 6/1990 | Japan . |
| 2-237302 | 9/1990 | Japan . |
| 3-114296 | 5/1991 | Japan . |
| 2212006 | 7/1989 | United Kingdom . |

*Primary Examiner*—Carl J. Arbes
*Attorney, Agent, or Firm*—Mark D. Hilliard; Robert A. McCann; Michael J. Turgeon

[57] ABSTRACT

A communication connector having a plurality of contact pairs for conductive connection to respective communication signal wire pairs is provided with a capacitor label that capacitively couples a first contact of one contact pair to a second contact of a second contact pair to reduce near end cross talk between adjacent contacts. A common conductive lamina disposed closely adjacent to and spaced from more than one of the contacts further improves near end cross talk performance of the communication connector.

20 Claims, 22 Drawing Sheets

COMMUNICATION CONNECTOR WITH CAPACITOR LABEL

This is a divisional of application Ser. No. 07/997,277 filed Dec. 23, 1992, U.S. Pat. No. 5,513,065.

TECHNICAL FIELD

The present invention relates generally to modular communication connectors used to interconnect computers through twisted pairs of telephone wires for high speed digital signal transmission, and more specifically relates to modular communication connectors having means for reducing near end cross talk between the contacts of each connector.

BACKGROUND ART

A printed circuit board telephone jack connector that utilizes tombstone capacitors connected between each contact and a ground plane for bypassing noise and high frequency signals to ground is suggested in U.S. Pat. No. 4,695,115. Also see U.S. Pat. No. 4,772,224 which suggests a similar modular printed circuit board jack that utilizes parallelepiped capacitors in a similar manner. Both of these connectors require an electrical grounding path connected to each capacitor of each contact, comprising a conductive cover member that is soldered to the ground of a printed circuit board.

With ever increasing signal transmission rates there is a need for modular communication connectors that have improved near end cross talk performance. Recently a new telecommunications systems bulletin specification titled "Additional Transmission Specifications for Unshielded Twisted-Pair Connecting Hardware" was issued by the Telecommunications Industry Association and the Electronic Industries Association "TIA/EIA" specifying three, increasing levels of performance Category 3, Category 4 and Category 5. Category 5 is the highest connector performance level characterized by acceptable performance at up to 100 MHz frequencies and 100 Mbps transmission rates.

Increasing performance requirements of modular communication connectors for high speed LAN applications establishes a need in the art for modular communication connectors that can be economically manufactured to achieve higher levels of performance in suppressing near end cross talk.

SUMMARY OF THE INVENTION

It is the object of the present invention to provide a modular communication connector with improved near end cross talk performance.

In general a communication connector includes a plurality of contact pairs for conductive connection to respective communication signal wire pairs where a capacitor label is provided to capacitively couple a first contact of one contact pair to a second contact of a second contact pair to improve near end cross talk performance. A common conductive lamina disposed closely adjacent to and spaced from more than one of the contacts further enhances near end cross talk performance of the connector.

DESCRIPTION OF THE PREFERRED EMBODIMENTS

Figure 1:
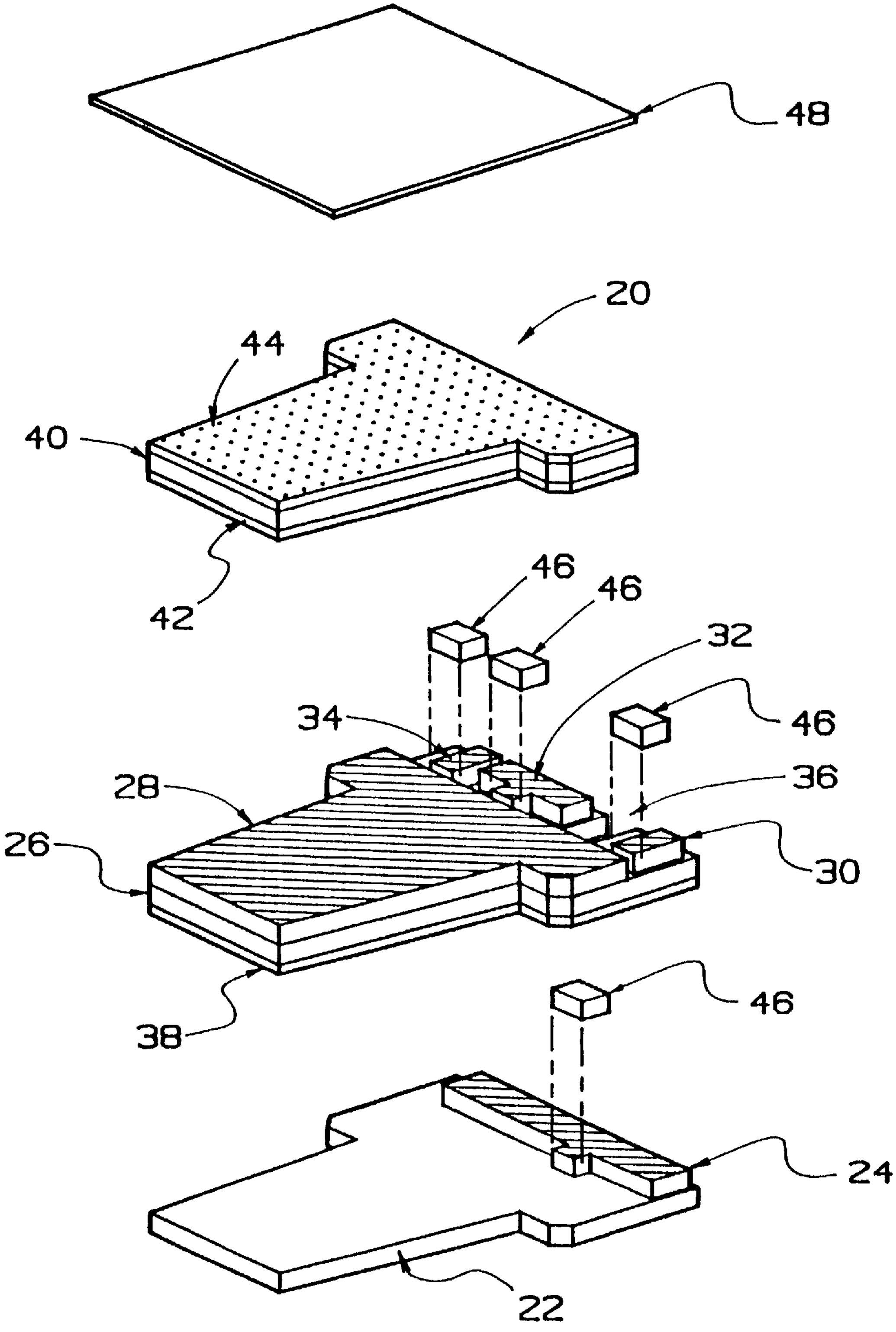
FIG. 1 is an exploded assembly perspective view of a capacitor label for use with a communication connector of FIG. 6 embodying the concept of the present invention.
Figure 2:
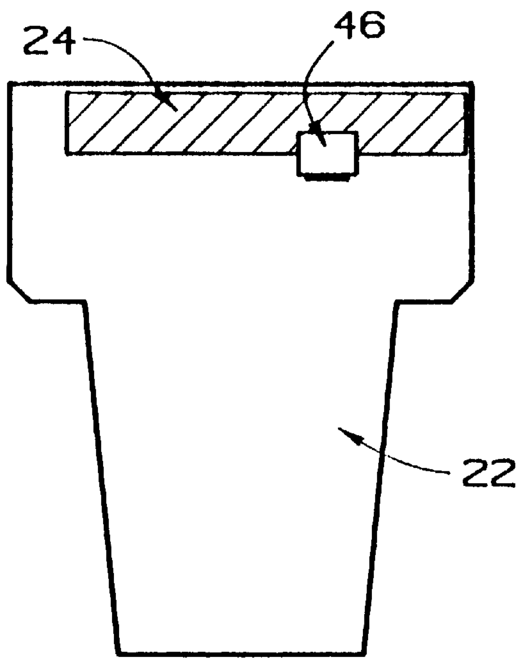
FIG. 2 is a top view of a conductive lamina printed on the surface of an insulating substrate of the label of FIG. 1.
Figure 3:
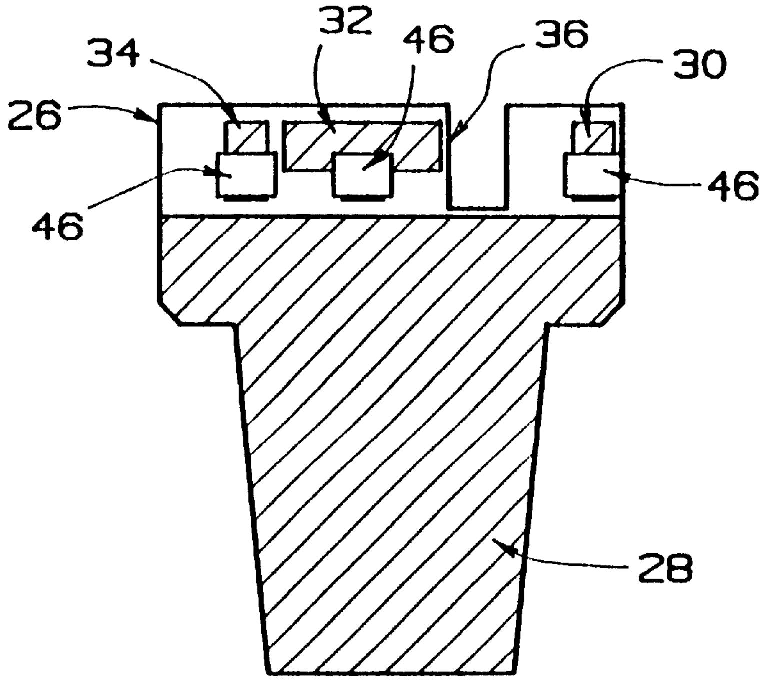
FIG. 3 is top view of a plurality of conductive laminas printed on a dielectric layer of the label of FIG. 1.
Figure 4:
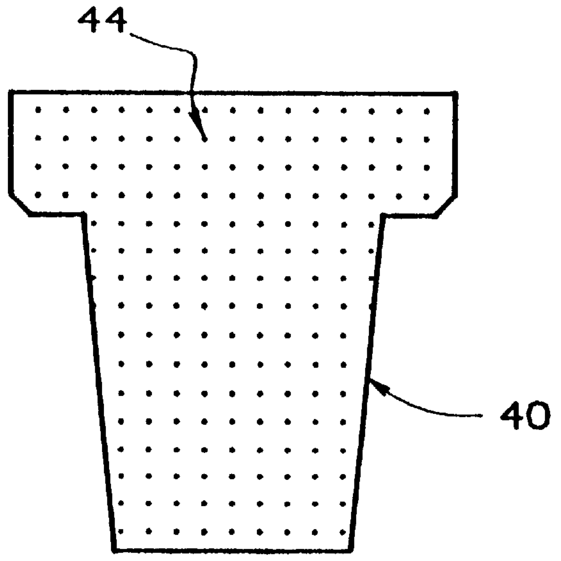
FIG. 4 is a top view of an insulating layer of the label of FIG. 1 covered by an adhesive lamina.
Figure 5:
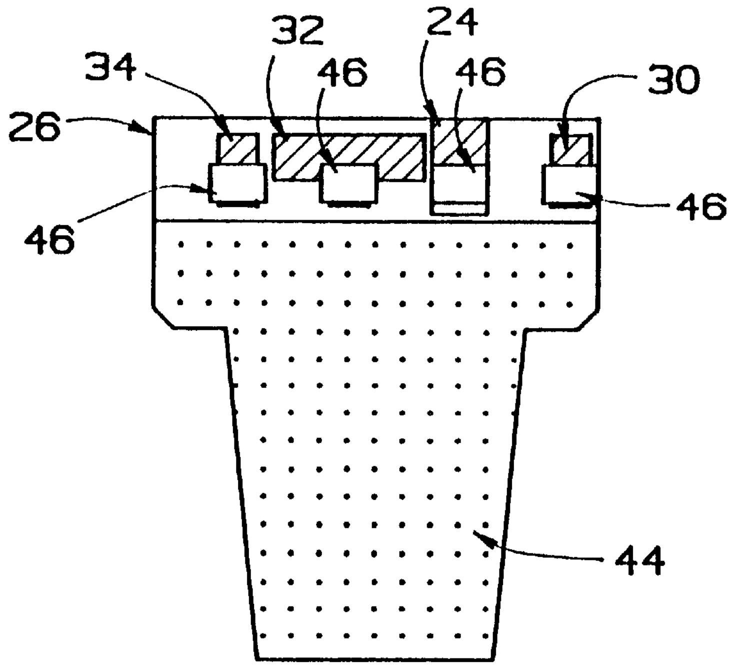
FIG. 5 is a top view of the label of FIG. 1 with a top release paper layer removed and ready for application to a connector.

A first embodiment of a capacitor label specially designed for application to a modular communication connector is designated generally by the numeral 20 in FIGS. 1–8 in the accompanying drawings. The various layers depicted in the accompanying drawings are shown with increased thickness out of proportion to the surface of the label for clarity, the actual thickness of the layers varying from 0.0005 inch (0.0013 cm) to 0.003 inch (0.0076 cm).

Capacitor Label 20 is formed by the assembly of a plurality of layers of insulating and conductive materials adhesively joined together. Printed on an insulating substrate 22 is a C3 conductive lamina 24. Insulating substrate 22 is preferably constructed of 0.001 to 0.003 inch (0.0025–0.0076 cm) thick layer of polyimide material, for example, Dupont's Kapton™ polyimide.

Printed on a dielectric layer 26, which is preferably formed of a 0.001 inch (0.0025 cm) thick layer of Kapton™ polyimide, arena forward conductive lamina 28, a C1 conductive lamina 30, a C5 conductive lamina 32, and a C7 conductive lamina 34. Forward conductive lamina 28 and C1, C3, C5 and C7 conductive laminas 24, 30, 32 and 34 are preferably constructed of a 0.001 inch (0.0025 cm) thick layer of conductive silver ink, for example, Dupont's "5007" silver ink or Colonial's "E8205" silver ink. Conductive laminas can also be formed of conductive metal foils, such as a 0.002 inch (0.0051 cm) copper foil. A sheet of copper foil can be laminated to an insulating layer and then etched by either a wet or dry process to form the desired contours of the individual conductive laminas.

A notch 36 is formed in dielectric layer 26, allowing access to C3 conductive lamina 24.

Dielectric layer 26 extends over C3 conductive lamina 24 separating C1, C5 and C7 laminas 30, 32 and 34 from C3 conductive lamina 24 such that lamina 24 and each of conductive laminas 30, 32 and 34 are capacitively coupled. The overlapping area of each conductive lamina 30, 32 and 34 relative to C3 conductive lamina 24, the distance between the same, the properties of the dielectric separating the same and the properties of the conductive lamina all affect the amount of capacitance produced across each pair of capacitively coupled lamina.

Dielectric layer 26 is adhesively secured to substrate 22 by a 0.0005 inch (0.0013 cm) thick adhesive lamina 38 preferably of an acrylic adhesive, for example Minnesota Mining and Manufacturing Company's "3M™ 467" adhesive. Other alternative adhesives are ultraviolet curable adhesives or silicone adhesives. A 0.001 inch (0.0025 cm) thick Kapton™ polyimide insulating layer 40 is secured to dielectric layer 26 and the conductive lamina carried thereon by an adhesive lamina 42. An upper adhesive lamina 44 is carried on the upper surface of insulating layer 40. Adhesive laminas 42 and 44 are each formed of a 0.0005 inch (0.0013 cm) thick layer of acrylic adhesive identical to adhesive lamina 38. Conductive adhesive areas 46 are positioned on the respective surfaces of C1, C3, C5 and C7 conductive laminas 24, 30, 32 and 34. Release paper 48, which is preferably 3M's brand of high strength release paper, is releasably secured to insulating layer 40 by adhesive lamina 44.

Figure 6:
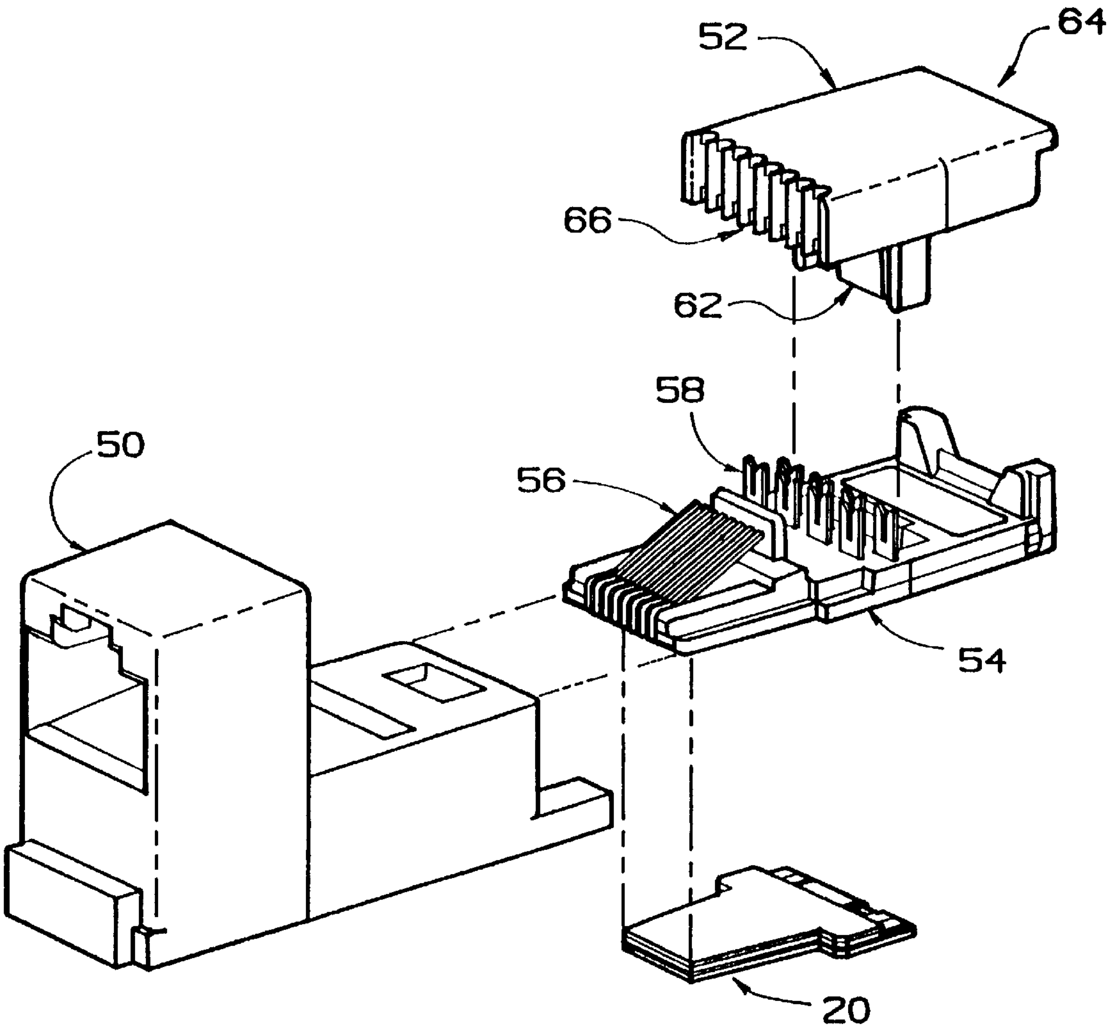
FIG. 6 is an exploded assembly perspective view showing a modular communication connector including a housing, a contact carrier and a wire positioning fixture and the label of FIG. 1.
Figure 7:
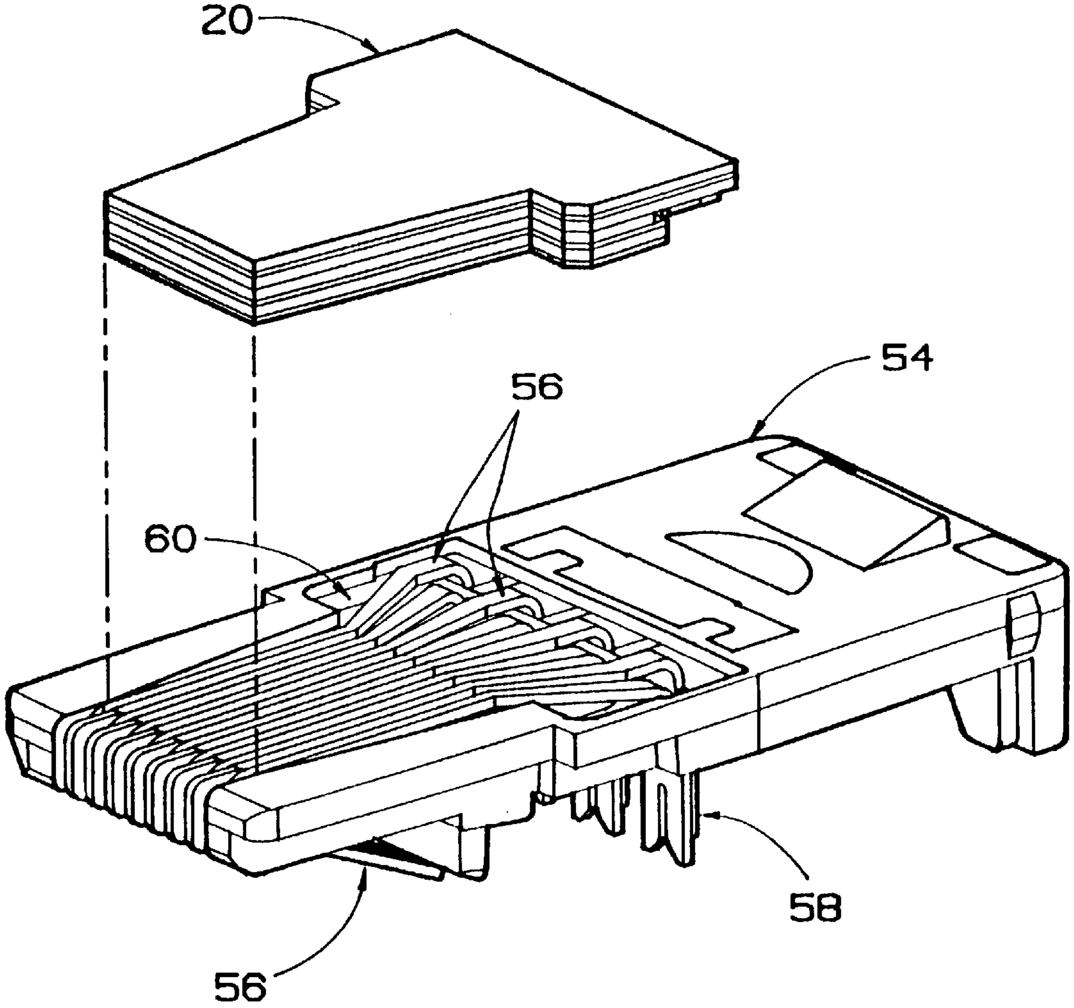
FIG. 7 is an exploded perspective view of the bottom of the contact carrier of the connector of FIG. 5, showing the position of the label of FIG. 1 relative to contacts of the connector of FIG. 6.
Figure 8:
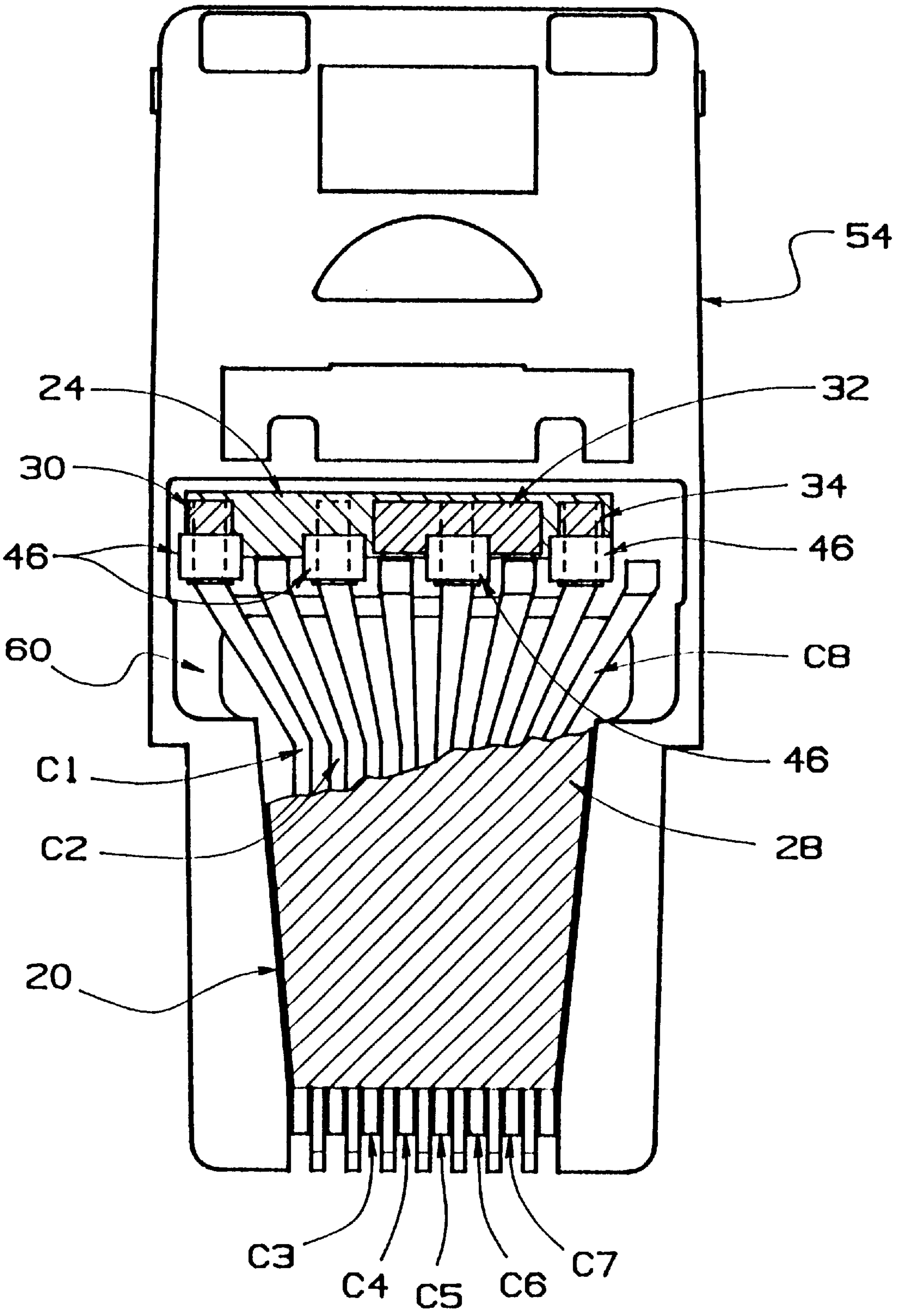
FIG. 8 is a bottom schematic view of the contact carrier of the connector of FIG. 6, with the label of FIG. 1 superimposed over contacts of the connector, with the conductive lamina of the label of FIG. 1 disposed in reverse order to disclose the relative position of each conductive lamina relative to the contacts.

Label 20, as best seen in FIGS. 6–8, is specially constructed for application to a modular communication connector which includes a housing 50, wire positioning fixture 52 and contact carrier 54. See U.S. Pat. No. 5,118,310 assigned to common assignee Panduit Corp., which is incorporated herein by reference, for a more detailed description of the modular connector.

Contact carrier 54 positions a plurality of contacts 56 each having an insulation displacement portion 58. As seen in FIG. 7, contacts 56 are positioned within a recess 60 of contact carrier 54. Label 20 is shaped to fit within recess 60. Label 20 is adhesively secured to contacts 56 by adhesive lamina 44 and is conductively secured to selective contacts 56 by conductive adhesive areas 46.

Conductive adhesive areas 46 preferably are either areas of conductive adhesive transfer tape as depicted in FIGS. 1, 2, 3, 5 and 8, such as 3M's Scotch™ 9703 anisotropic conductive adhesive transfer tape having conductive silver coated particles or of liquid drops of silver filled epoxy adhesive, which cure at room temperature, one example being Emerson and Cuming's Amicon™ CSM 933-65-1 adhesive. Printed carbon filled adhesive areas are a less desirable alternative.

3M's anisotropic conductive adhesive tape conducts electricity only through the thickness of the tape and thus may also be applied as a single piece that is positioned between and adhered to all of the contacts that are to be conductively connected and the conductive laminas to which the contacts are to be respectively connected. The application of a single adhesive area in this manner should reduce the complexity of assembly and cost of manufacture of the communication connector.

Another method of conductively engaging contacts 56 with conductive lamina in any of the relevant embodiments of the present invention include forming the housing and contacts such that the housing resiliently biases each contact into conductive engagement with a respective conductive lamina. The contact may also be held in conductive engagement with a respective conductive lamina by a fixture and then permanently secured thereto by a non-conductive adhesive. Copper foil conductive laminas can also either be soldered or microwelded to respective contacts.

FIG. 8 schematically depicts the positional relationship of contacts C1 through C8, C1, C3, C5 and C7 conductive laminas 30, 24, 32 and 34 and conductive adhesive areas 46, with these components stacked in reverse order for clarity. Adhesive areas 46 respectively connect contact C1 to C1 conductive lamina 30, contact C3 to C3 conductive lamina 24, contact C5 to C5 conductive lamina 32 and contact C7 to C7 conductive lamina 34.

C1 through C8 contacts define a standard communication connector for termination of four pair of twisted wires, contacts C1 and C2, contacts C3 and C6, contacts C4 and C5 and contacts C7 and C8 each comprising a signal pair.

Figure 9:
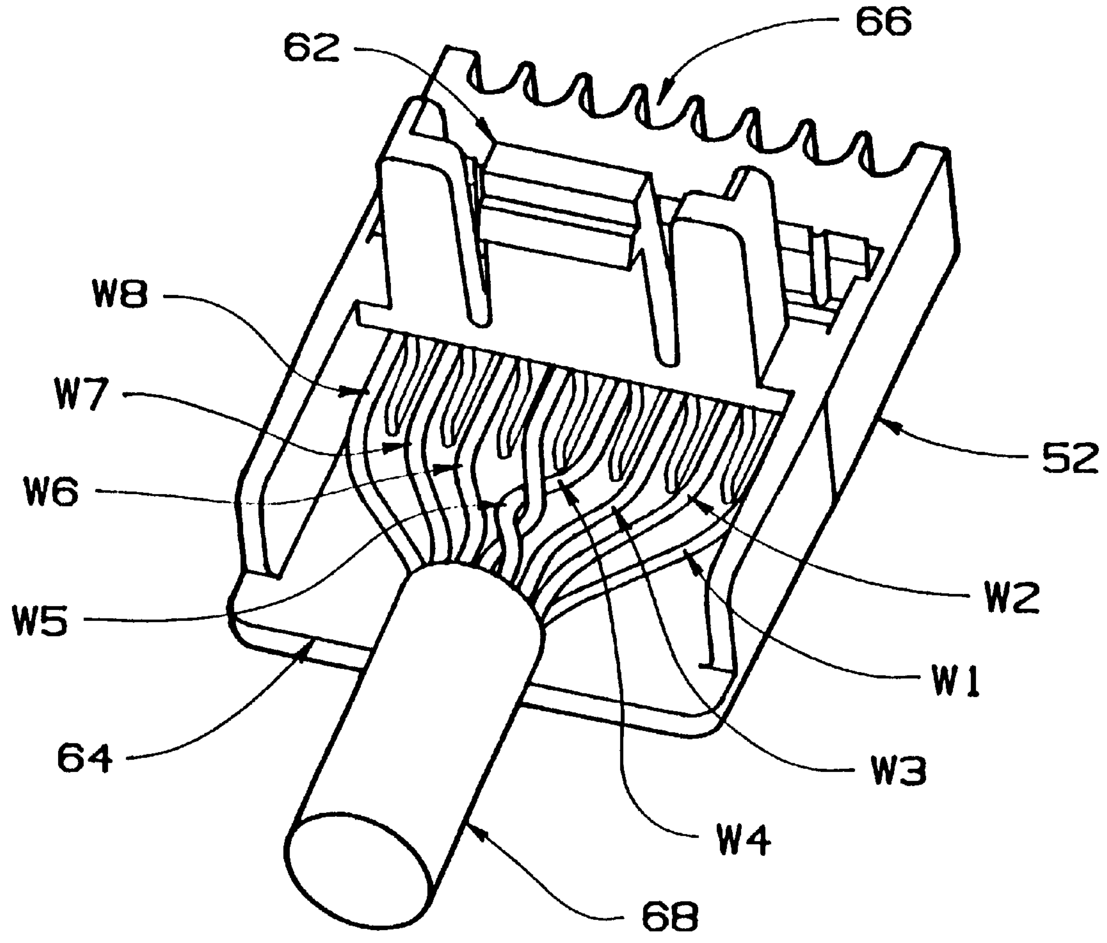
FIG. 9 is a perspective view of the wire positioning fixture of the connector of FIG. 6.

As seen in FIGS. 6 and 9, wire positioning fixture 52 includes a latch 62 that secures fixture 52 to housing 50. Fixture 52 includes a wire entry end 64 and a plurality of wire exit slots 66. A cable 68 includes a plurality of twisted pairs of wires designated W1 through W8.

As seen in FIG. 9, wires W1 and W2, wires W3 and W6, wires W4 and W5, and wires W7 and W8 each comprise a pair of twisted wires the terminal ends of which are straightened, positioned in wire positioning fixture 52, disposed adjacent to respective contacts and terminated to corresponding contacts C1 through C8.

Preferably, the terminal ends of wires W4 and W5 are twisted around each other one complete turn before insertion into fixture 52, as seen in FIG. 9, which has been found to further improve the near end cross talk performance of the communication connector of FIG. 6. The specific pair of terminally twisted wires W1 through W8 that will enhance performance may vary depending upon the wiring pair scheme of the connector and cable.

In order to reduce cross talk between signal pairs of contacts it is desirable to add capacitance between adjacent pairs. The amount of capacitance and the individual wires of each pair to be coupled is dependent upon the relative position of the individual contacts of each pair of contacts and manufacturing considerations of the capacitor label.

The preferred configuration and approximate desired capacitance between each coupled contact for a connector having the contact signal pairs described above is to capacitively couple contacts C1, C5 and C7 to contact C3 with respective capacitance's of 2.1 pF, 8.5 pF and 2.1 pF.

A second arrangement of equal performance is capacitively couple contacts C 3 and C5, C3 and C7, and C2 and C6 with respective capacitance of 5.9 pF, 1.9 pF and 1.9 pF.

Another arrangement of expected equal performance would be to capacitively couple contacts C2, C4 and C8 each to contact C6 with respective capacitance's of 2.1 pF, 8.5 pF and 2.1 pF.

Also depicted, partially broken away is forward conductive lamina 28 which is disposed closely adjacent to and covering the forward portion of contacts C1–C8. See FIG. 3, which discloses the full extent of forward conductive lamina 28.

Forward conductive lamina 28 as depicted in FIGS. 1–8 is a planar layer disposed adjacent contacts 56 which is believed to reduce cross talk between contact pairs by disrupting the coupled field between contacts reducing the field strength and reducing cross talk. An alternative disposition of lamina 28 includes weaving the conductive lamina, while separated from the contacts by a dielectric, over and under adjacent contacts 56 which is even more effective than a planar conductive lamina, although more difficult to manufacture. Forward conductive lamina 28 can also be placed between contacts 56 and contact carrier 54, or in any other disposition closely adjacent contacts 56. For the capacitor labels and contacts disclosed herein it has been found that the forward conductive lamina is spaced closely adjacent the contacts and, thus, has a significant effect when it is within 0.005 inch (0.0127 cm) of the contacts, although the exact range will vary with different conductive lamina and contact configurations.

Label 20 applied to a communication connector as described above achieves the highest category 5, TIA/EIA TSB40 level of performance. A capacitor label constructed with only a forward conductive lamina 28 or with only C1, C3, C5 and C7 conductive laminas 24, 30, 32 and 34 improves the cross talk performance of a communication connector.

Figure 10:
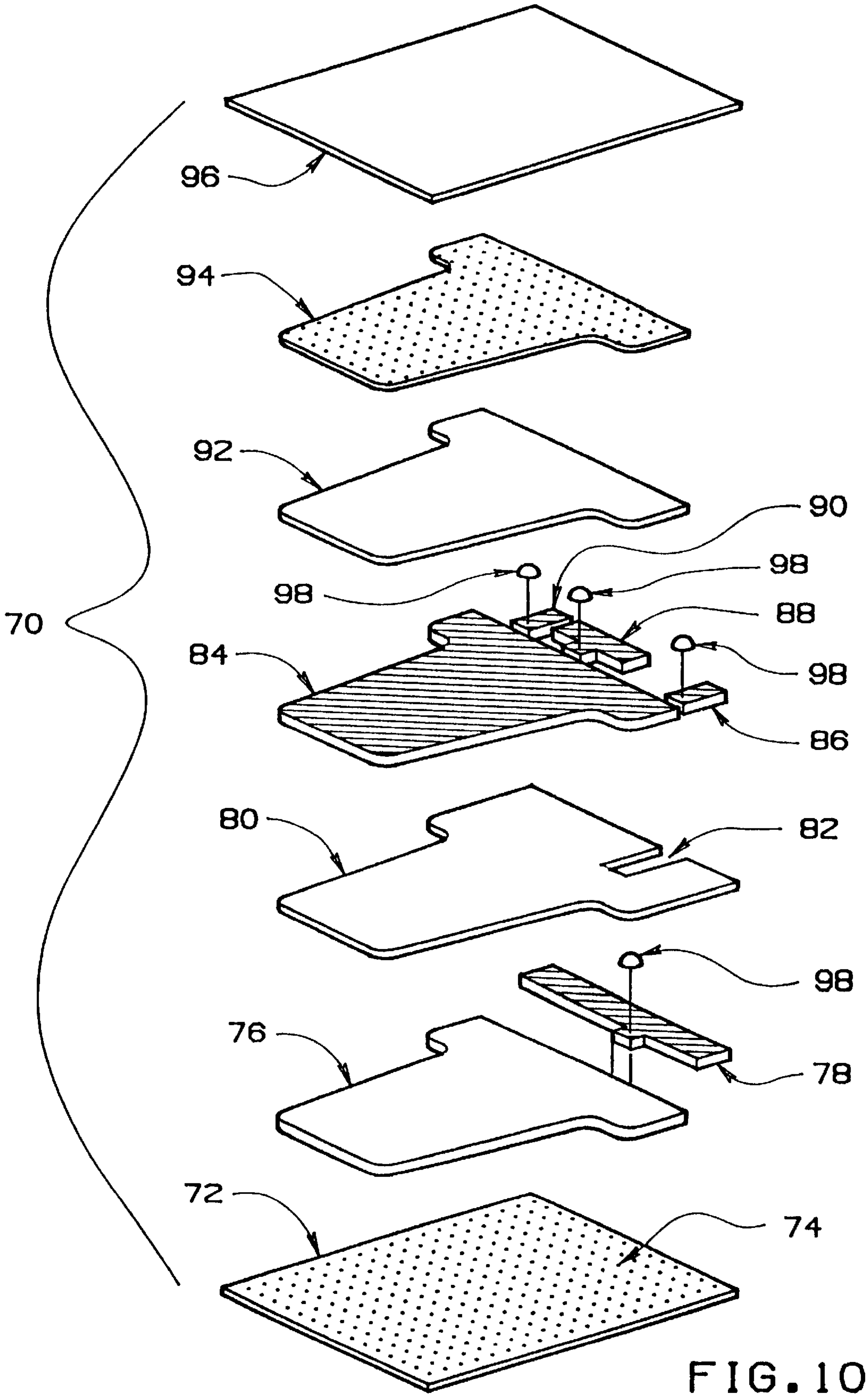
FIG. 10 is an exploded assembly perspective view of an alternative embodiment of a printed capacitor label for use with the communication connector of FIG. 6 embodying the concept of the present invention.

A second embodiment of the present invention, as seen in FIG. 10, is a printed capacitor label 70 specially designed for application to a modular communication connector of FIGS. 6–8. The contours of the components of label 70 are identical to label 20 and label 70 is secured to the modular connector of FIGS. 6–8 in an identical manner.

Printed capacitor label 70 is formed by printing a plurality of layers of insulating and conductive materials on a substrate with label 70 being releasably attached to a pre-mask layer 72 by adhesive layer 74. Pre-mask layer 72 functions as a fixture allowing accurate fine manipulation and alignment of label 70 for application to the contacts of a connector. Pre-mask layer 72 is constructed of a 0.003 inch (0.0076 cm) layer of polyester film having an acrylic temporary low tack adhesive applied to one surface. In preferred form pre-mask 72 would position a matrix of a plurality of labels 70 such that pre-mask 70, when aligned with a second fixture (not shown) that positions a plurality of contact carriers 54, would be used to apply a plurality of labels to individual contact carriers.

An insulating substrate 76 is releasably secured to pre-mask 72. All of the subsequent layers of label 70, including insulating layers are printed sequentially on substrate 76.

Printed on substrate 76 in the following order are a C3 conductive lamina 78; a printed dielectric lamina 80 having a notch 82 allowing conductive access to lamina 78; forward conductive lamina 84, C1 conductive lamina 86, C5 conductive lamina 88, and C7 conductive lamina 90; printed insulating lamina 92; and adhesive lamina 94. A standard release paper layer 96 is then applied to cover adhesive lamina 94. Finally, just prior to application of label 70 to the contacts of a connector, drops of liquid adhesive 98 are applied to portions of C1, C3, C5 and C7 conductive lamina 86, 78, 88 and 90 in alignment with each respective contact of the connector. Substrate 76 is preferably constructed of 0.001 to 0.002 inch (0.0025–0.0051 cm) thick layer of polyimide material, for example, Dupont's Kapton™ polyimide.

Conductive lamina 78, 84, 86, 88 and 90 are printed layers of 0.001 inch (0.0025 cm) thick layer of conductive silver ink, for example, Dupont's "5007" silver ink or Colonial's "E8205" silver ink. Conductive laminas can also be formed of conductive metal foils, such as 0.002 inch (0.0051 cm) copper foil.

Printed dielectric and insulating layers 80 and 92 are printed layers of 0.0018 inch (0.0046 cm) thick polymeric dielectric, for example DuPont's "5014D" polymeric dielectric or Minico's "M-UVF-10G" ultraviolet polymer solder mask.

Liquid adhesive drops 98 are preferably liquid drops of silver filled epoxy adhesive, which cures at room temperature, one example being Emerson and Cuming's Amicon™ CSM 933-65-1 adhesive.

Dielectric layer 80 extends over C3 conductive lamina 78 separating C1, C5 and C7 laminas 86, 88 and 90 from C3 conductive lamina 24 such that lamina 78 and each of conductive laminas 86, 88 and 90 are capacitively coupled. The areas of each of C1, C5 and C7 conductive laminas 86, 88 and 98 that overlap C3 conductive lamina 78 are respectively 0.003 square inches (0.0194 square cm), 0.012 square inches (0.0774 square cm) and 0.003 square inches (0.0194 square cm). For a printed dielectric lamina 80 having a dielectric constant of 5.7, the capacitance values measured between the C1, C5 and C7 conductive laminas and the C3 conductive laminas are respectively 2.4 pF, 8.5 pF and 1.9 pF.

Figure 11:
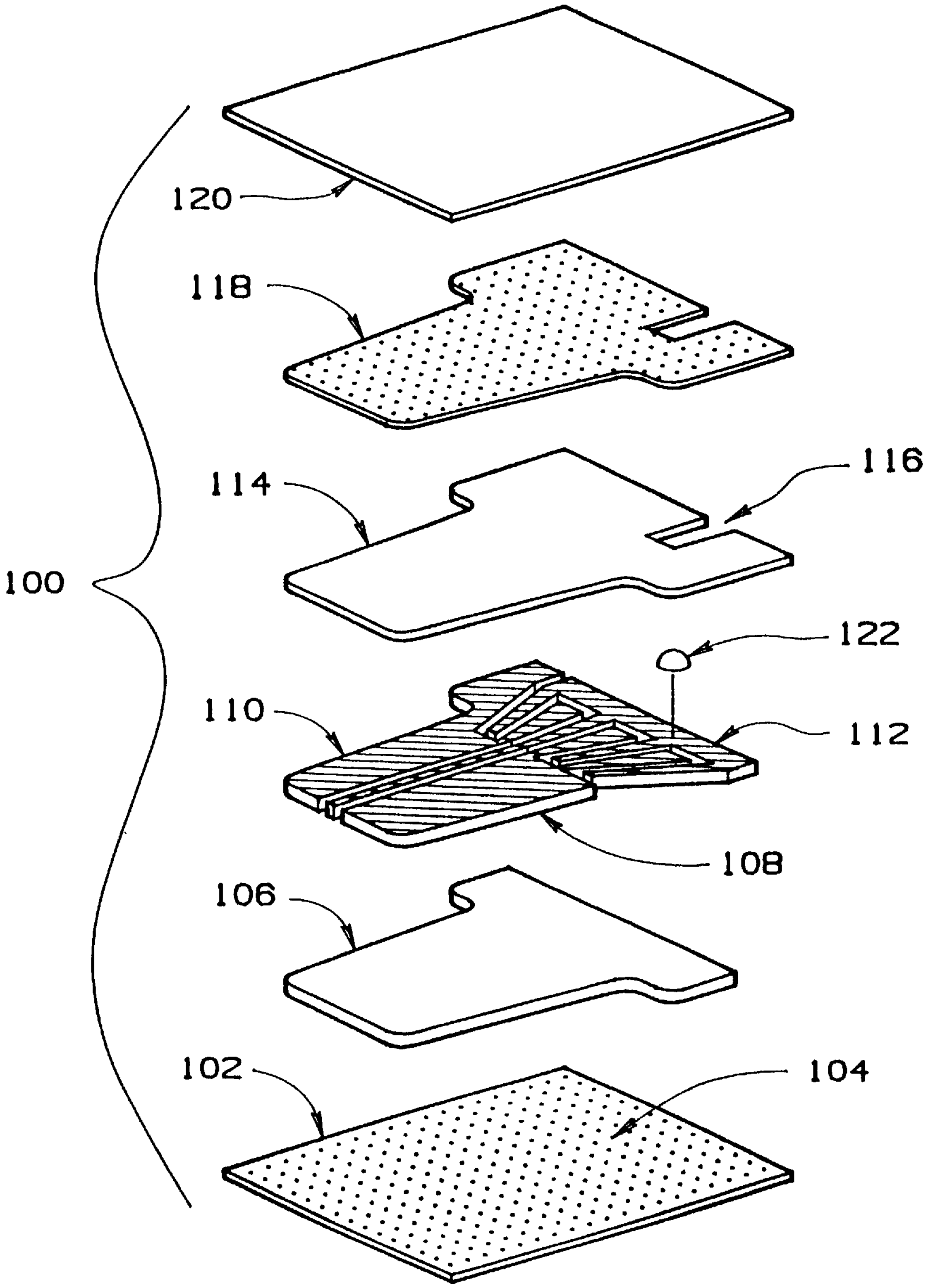
FIG. 11 is an exploded assembly perspective view of an alternative embodiment of a single point of contact capacitor label for use with the communication connector of FIG. 6 embodying the concept of the present invention.
Figure 12:
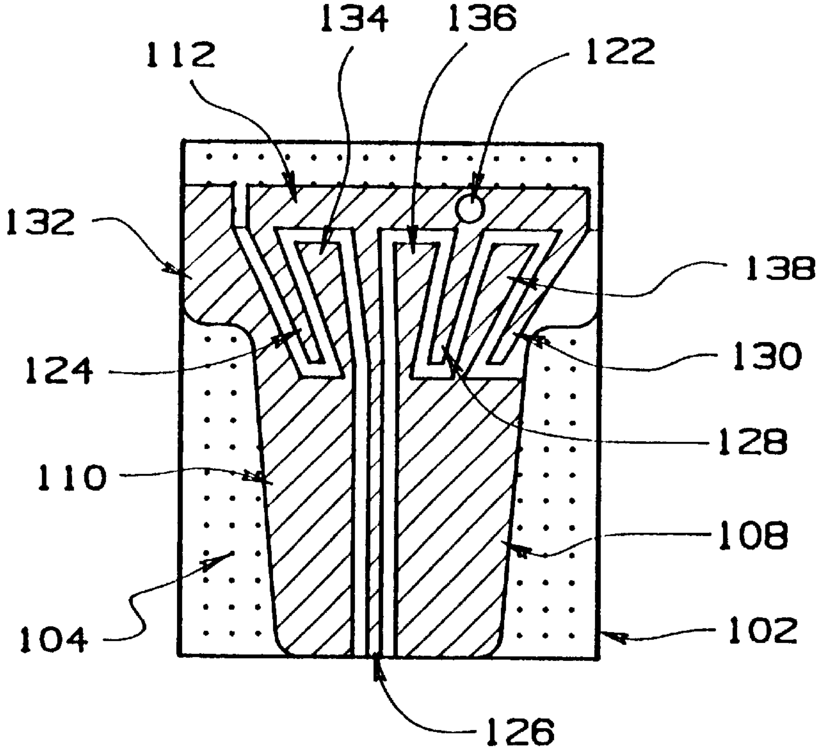
FIG. 12 is a top view of a conductive lamina printed on the surface of an insulating substrate of the label of FIG. 11.
Figure 13:
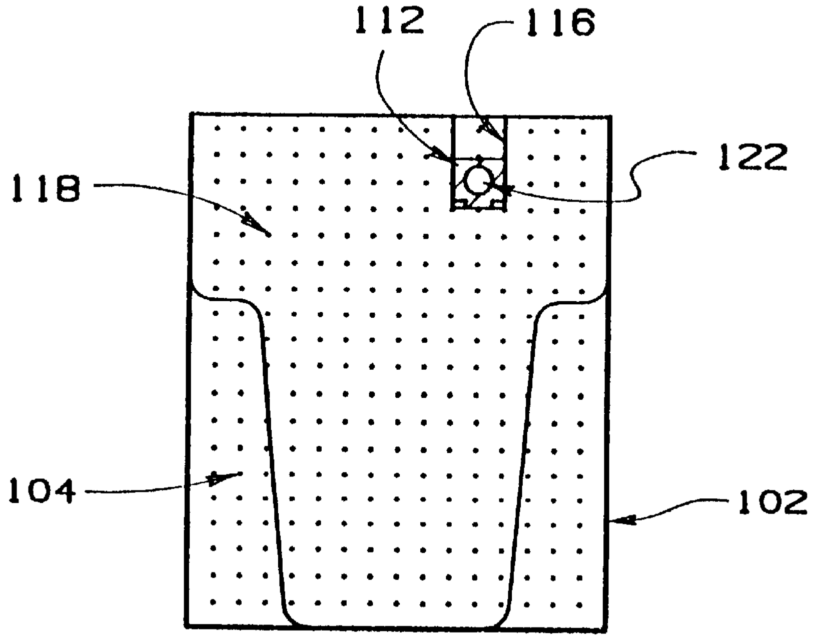
FIG. 13 is a top view of the label of FIG. 11 with a top release paper layer removed and ready for application to a connector.

A third embodiment of the present invention, as seen in FIGS. 11–13, is a single point of contact capacitor label 100 specially designed for application to a modular communication connector of FIGS. 6–8.

Although it is believed that label 100 will be effective in suppressing near end cross talk, it has not been found to achieve as high a level of performance as labels 20 and 70, but does offer an alternative construction that may be more desirable where the highest level of performance is not necessary.

Label 100 is secured to the modular connector of FIGS. 6–8 with a single contact of the connector being adhesively secured to a conductive lamina of label 100.

Printed capacitor label 100 is formed by printing a plurality of layers of insulating and conductive materials on a substrate with label 100 being releasably attached to a polyester film pre-mask layer 102 by an acrylic adhesive layer 104 in the manner and for the purposes disclosed above.

An insulating substrate 106 is releasably secured to premask 102. All of the subsequent layers of label 100, including the insulating layers, are printed sequentially on substrate 106.

Printed on substrate 106 in the following order are the following conductive lamina: first forward conductive lamina 108, second forward conductive lamina 110, C1, C3, C5 and C7 conductive lamina 112; printed dielectric lamina 114 having a notch 116 allowing access to conductive lamina 112; and adhesive lamina 118. Release paper layer 120 is then applied to cover adhesive lamina 118. Finally, just prior to application of label 100 to the contacts of a connector, a drop of liquid adhesive 122 is applied to C1, C3, C5 and C7 conductive lamina 112 in alignment with contact C3 of the connector.

Dielectric layer 114 extends over C1, C3, C5 and C7 conductive lamina 112 dialectically separating lamina 112 from contacts C1, C5 and C7 such that respective elongate portions 130, 126 and 124 of lamina 112 and contacts C1, C5 and C7 are capacitively coupled, as best seen in FIG. 12.

After application of label 100, elongate portions of C1, C3, C5 and C7 conductive lamina 112 are aligned with adjacent portions of contacts with a C7 aligned portion 124, a C5 aligned portion 126, a C3 aligned portion 128 and a C1 aligned portion 130 being respectively aligned with contacts C7, C5, C3 and C1 of FIG. 8. C5 aligned portion 126 extends to the end of label 100 along the length of contact 5 increasing the capacitive coupling of portion 126 and contact C5.

Second forward conductive lamina 110 includes a C8 aligned portion 132 and a C6 aligned portion 134 which each respectively cover a rearward portion of contacts C8 and C6. First forward conductive lamina 108 includes a C4 aligned portion 136 and a C2 aligned portion 138 which each respectively cover a rearward portion of contacts C4 and C2.

Substrate 106 is preferably constructed of 0.001 to 0.002 inch (0.0025–0.0051 cm) thick layer of polyimide material, for example, Dupont's Kapton™ polyimide.

Conductive lamina 108, 110 and 112 are printed layers of 0.001 inch (0.0025 cm) thick layer of conductive silver ink, for example, Dupont's "5007" silver ink or Colonial's "E8205" silver ink. Conductive laminas can also be formed of conductive metal foils, such as 0.002 inch (0.0051 cm) copper foil.

Printed dielectric and insulating layers 106 and 114 are printed layers of 0.0018 inch (0.0046 cm) thick polymeric dielectric, for example DuPont's "5014D" polymeric dielectric or Minico's "M-UVF-10G" ultraviolet polymer solder mask.

Liquid adhesive drop 122 is preferably a liquid drop of silver filled epoxy adhesive, which cures at room temperature, one example being Emerson and Cuming's Amicon™ CSM 933-65-1 adhesive.

FIG. 13 depicts label 100 of FIG. 11, with release paper 120 removed, ready for application to contacts 56 of the connector.

Figure 14:
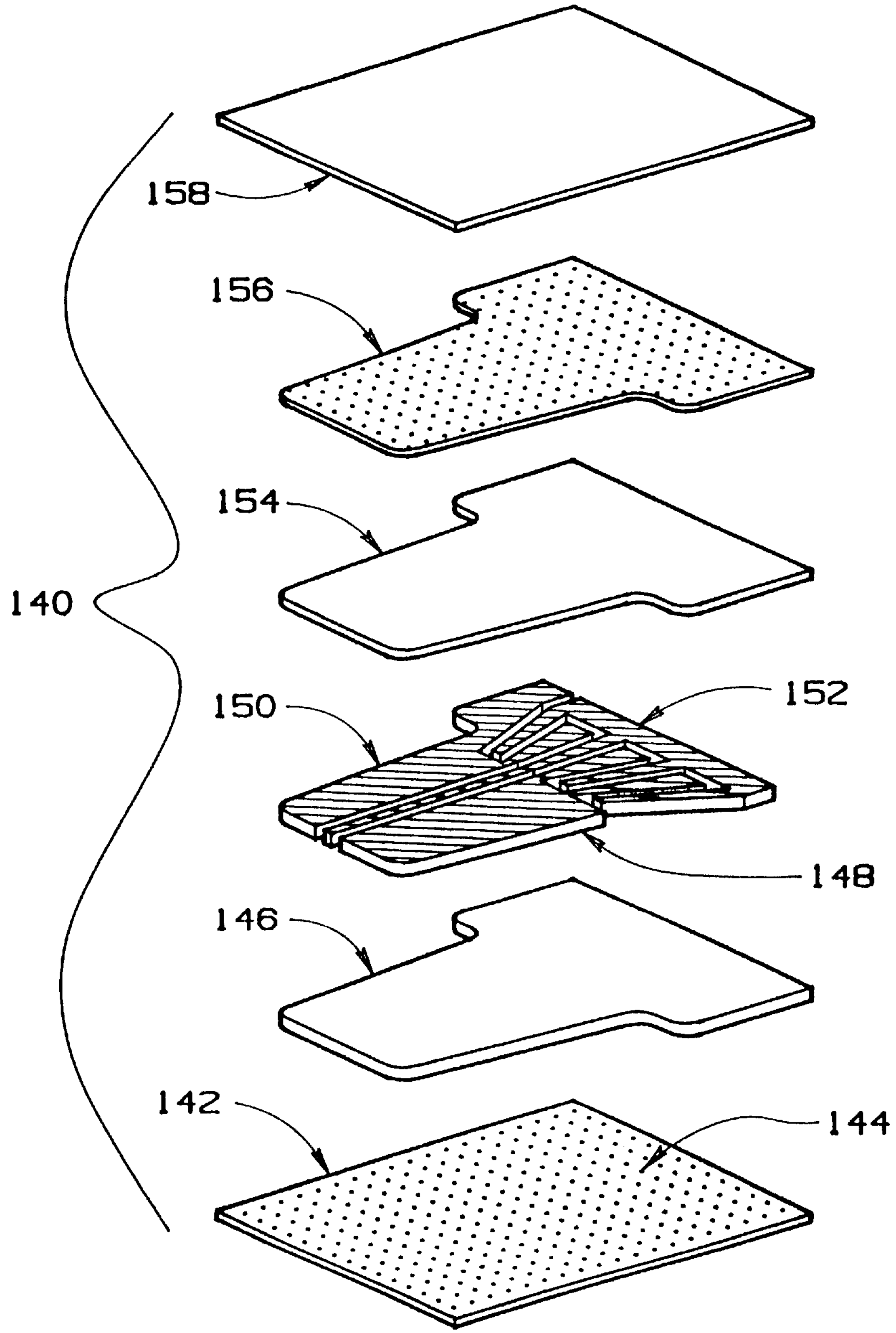
FIG. 14 is an exploded assembly perspective view of an alternative embodiment of a no point of contact capacitor label for use with the communication connector of FIG. 6 embodying the concept of the present invention.
Figure 15:
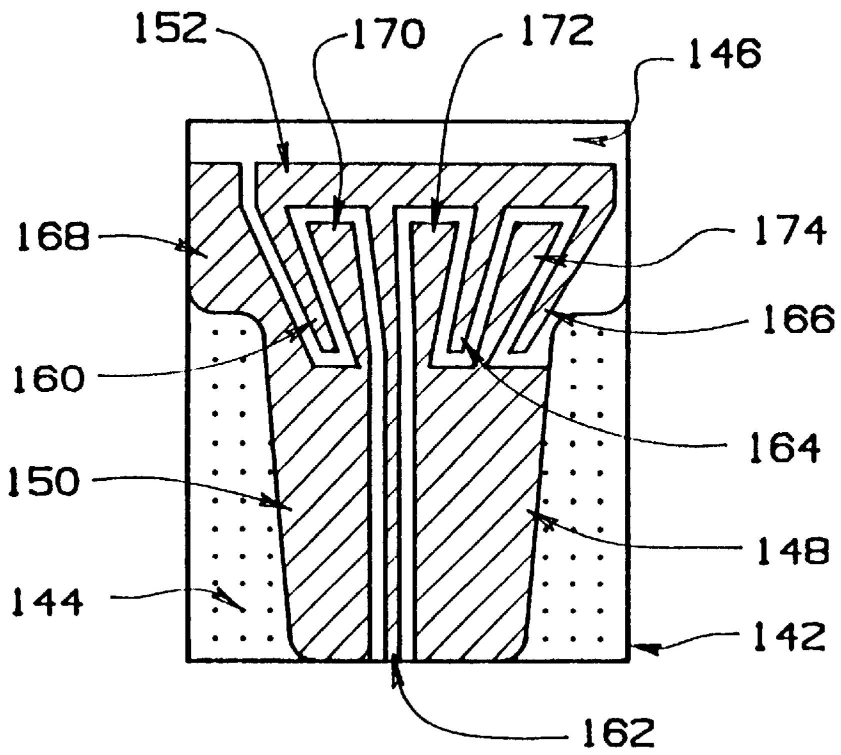
FIG. 15 is a top view of a plurality of conductive laminas printed on the surface of an insulating substrate of the label of FIG. 14.
Figure 16:
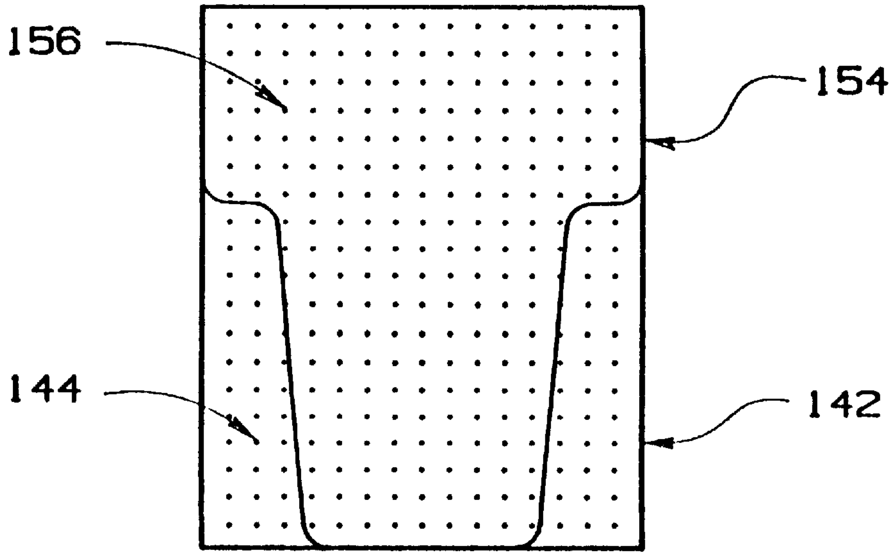
FIG. 16 is a top view of the label of FIG. 14 with a top release paper layer removed and ready for application to a connector.

A fourth embodiment of the present invention, as seen in FIGS. 14–16, is a no-point of contact capacitor label 140 specially designed for application to a modular communication connector of FIGS. 6–8.

Although label 140 is effective in suppressing near end cross talk, it has not been found to achieve as high a level of performance as labels 20 and 70, but does offer an alternative construction that may be more desirable where the highest level of performance is not necessary.

Label 140 is secured to the modular connector of FIGS. 6–8 without any conductive point of contact between the contacts of the connector and the conductive lamina of label 140.

Printed capacitor label 140 is formed by printing a plurality of layers of insulating and conductive materials on a substrate with label 140 being releasably attached to a polyester film pre-mask layer 142 by an acrylic adhesive layer 144 in the manner and for the purposes disclosed above.

An insulating substrate 146 is releasably secured to premask 142. All of the subsequent layers of label 100, including the insulating layers, are printed sequentially on substrate 146.

Printed on substrate 146 in the following order are the following conductive lamina: first forward conductive lamina 148, second forward conductive lamina 150, C1, C3, C5 and C7 conductive lamina 152; printed dielectric lamina 154; and adhesive lamina 156. Release paper layer 158 is then applied to cover adhesive lamina 156.

As seen in FIG. 15, after application of label 140, elongate portions of C1, C3, C5 and C7 conductive lamina 152 are aligned with adjacent portions of contacts with a C7 aligned portion 160, a C5 aligned portion 162, a C3 aligned portion 164 and a C1 aligned portion 166 being respectively aligned with contacts C7, C5, C3 and C1 of FIG. 8. C5 aligned portion 162 extends to the end of label 140 along the length of contact C5 increasing the capacitive coupling of aligned portion 162 and contact C5. As desired, aligned portions 160, 164 and 166 may be extended in the same manner to increase capacitive coupling of any individual aligned portion and contact combination.

Dielectric layer 154 extends over C1, C3, C5 and C7 conductive lamina 152 separating elongate aligned portions of C1, C3, C5 and C7 166, 164, 162 and 160 conductive lamina 152 from contacts C1, C3, C5 and C7 such that aligned portions 166, 164, 162 and 160 each are capacitively coupled with a respective contact.

Second forward conductive lamina 150 includes a C8 aligned portion 168 and a C6 aligned portion 170 which each respectively cover a rearward portion of contacts C8 and C6. First forward conductive lamina 148 includes a C4 aligned portion 172 and a C2 aligned portion 174 which each respectively cover a rearward portion of contacts C4 and C2.

Substrate 146 is preferably constructed of 0.001 to 0.002 inch (0.0025–0.0051 cm) thick layer of polyimide material, for example, Dupont's Kapton™ polyimide.

Conductive lamina 148, 150 and 152 are printed of 0.001 inch (0.0025 cm) thick layers of conductive silver ink, for example, Dupont's "5007" silver ink or Colonial's "E8205" silver ink. Conductive laminas can also be formed of conductive metal foils, such as 0.002 inch (0.0051 cm) thick copper foil.

Printed dielectric layer 154 is printed layers of 0.0018 inch (0.0046 cm) thick polymeric dielectric, for example DuPont's "5014D" polymeric dielectric or Minico's "M-UVF-10G" ultraviolet polymer solder mask.

FIG. 16 depicts label 140 of FIG. 14, with release paper 158 removed, ready for application to contacts 56 of the connector.

Figure 17:
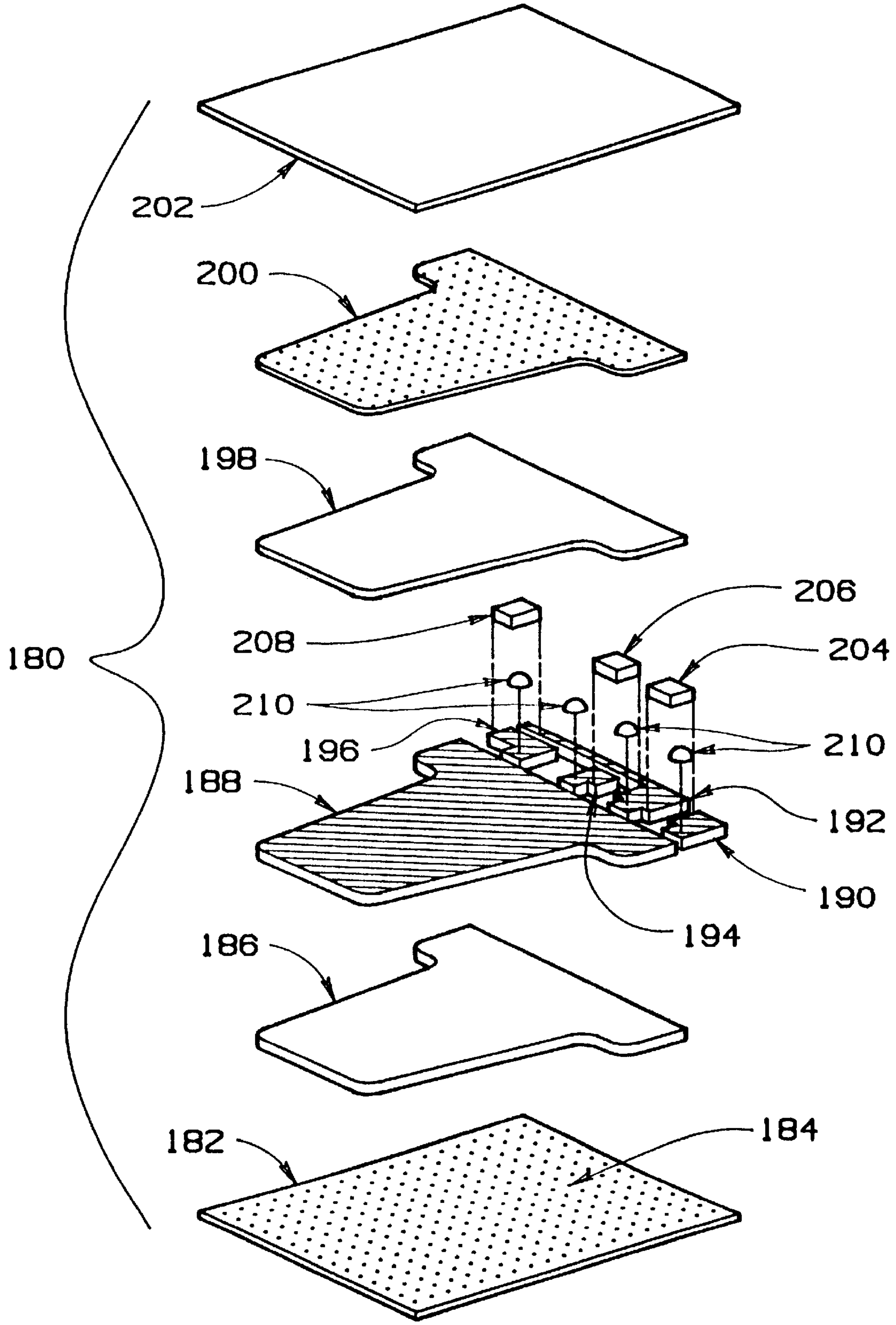
FIG. 17 is an exploded assembly perspective view of an alternative embodiment of a surface mount capacitor label for use with the communication connector of FIG. 6 embodying the concept of the present invention.
Figure 18:
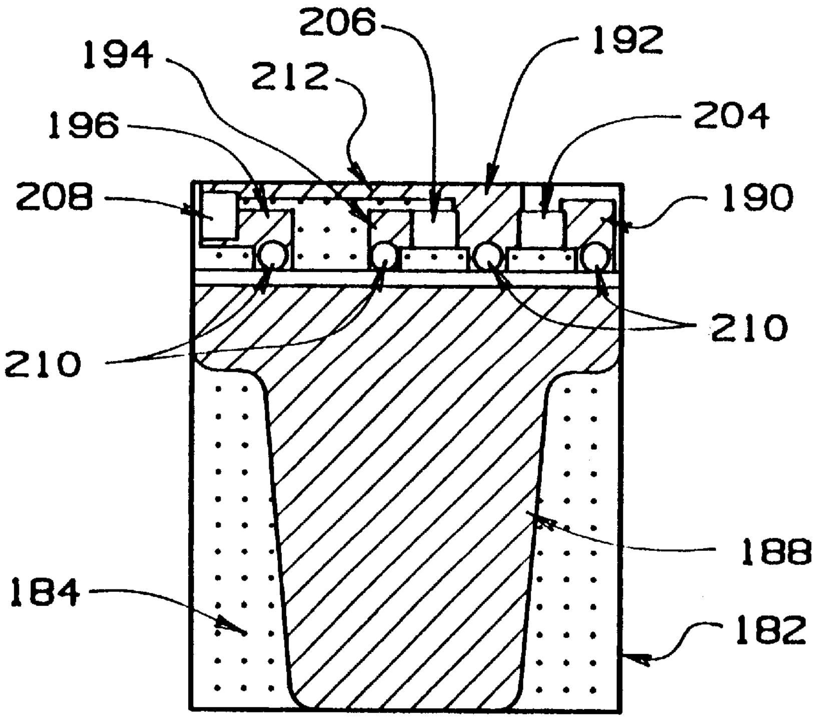
FIG. 18 is a top view of a plurality of conductive laminas printed on the surface of an insulating substrate of the label of FIG. 17.
Figure 19:
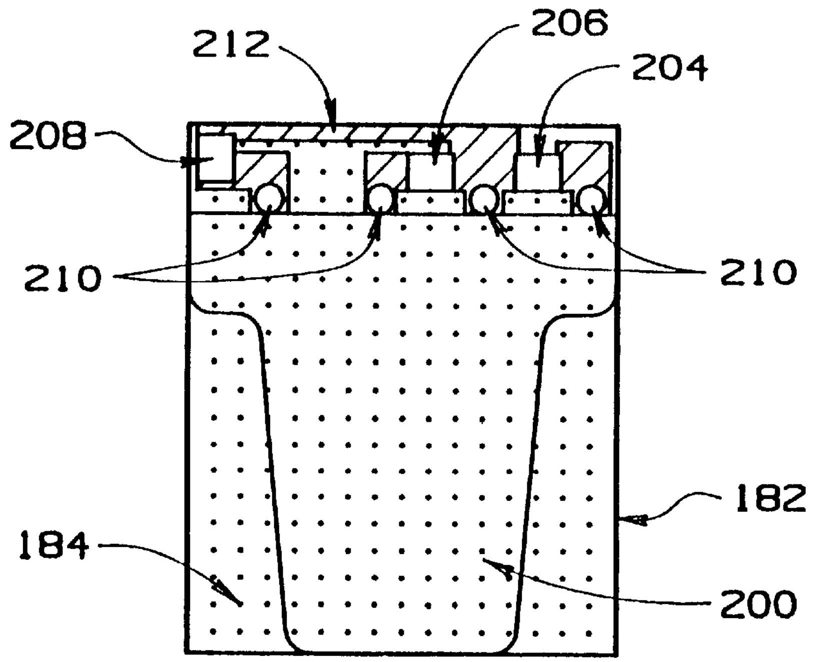
FIG. 19 is a top view of the label of FIG. 17 with a top release paper layer removed and ready for application to a connector.
Figure 20:
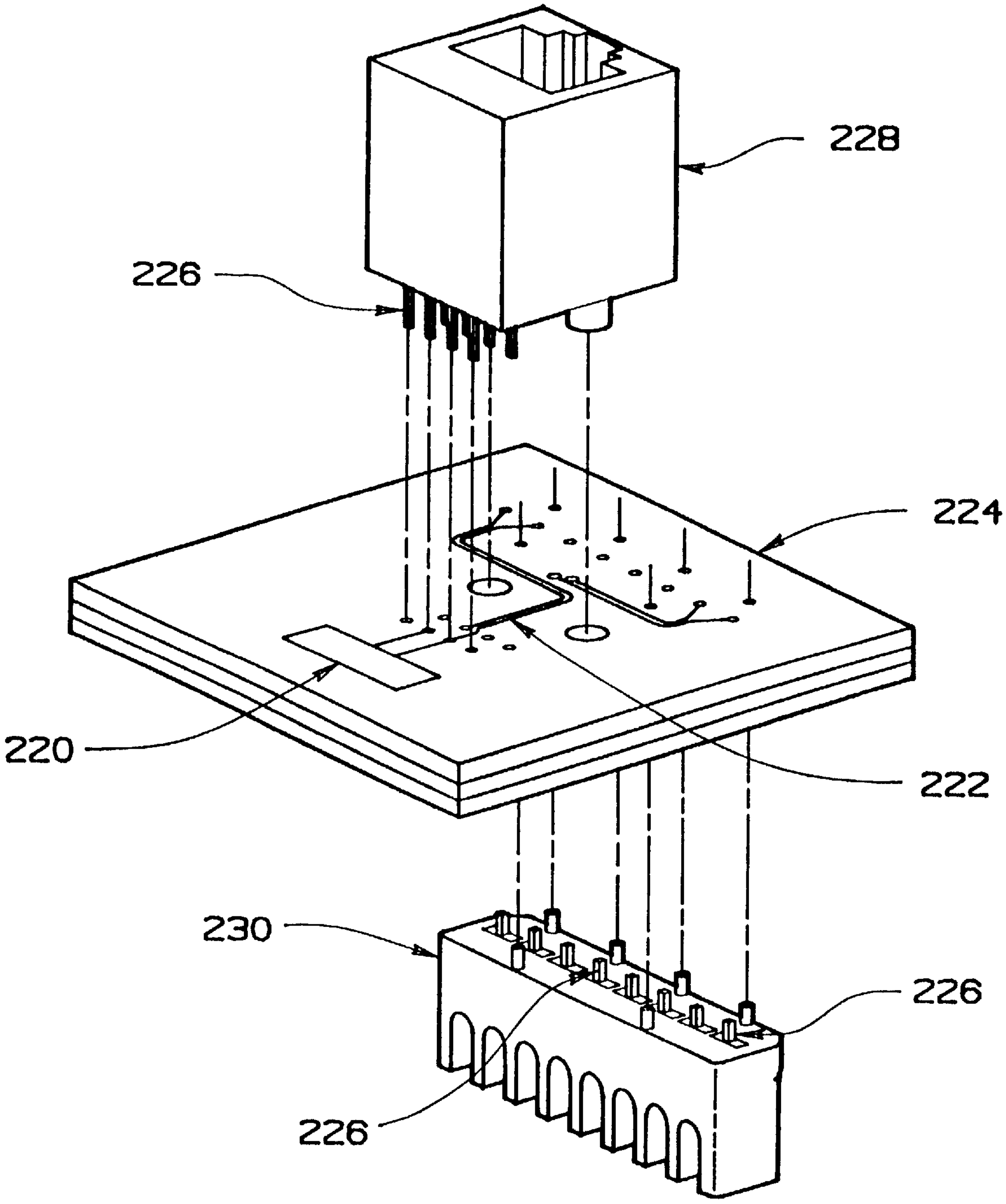
FIG. 20 is an exploded assembly perspective view of an alternative embodiment of a printed circuit board capacitor label and a printed circuit board communication connector embodying the concept of the present invention.

A fifth embodiment of the present invention, as seen in FIGS. 17–19, is a surface mount capacitor label 180 specially designed for application to a modular communication connector of FIGS. 6–8.

It is believed that label 180 will be as effective in suppressing near end cross talk as labels 20 and 70.

Label 180 includes a plurality of surface mount capacitors connected between conductive lamina which are in turn conductively adhered to selective contacts 56 of the connector.

Printed capacitor label 180 is formed by printing a plurality of layers of insulating and conductive materials on a substrate with label 180 being releasably attached to a polyester film pre-mask layer 182 by an acrylic adhesive layer 184 in the manner and for the purposes disclosed above.

An insulating substrate 186 is releasably secured to premask 182. All of the subsequent layers of label 100, including the insulating layers, are printed sequentially on substrate 186.

Printed on substrate 186 in the following order are the following conductive lamina: forward conductive lamina 188, C1 conductive lamina 190, C3 conductive lamina 192, C5 conductive lamina 194 and C7 conductive lamina 196; printed dielectric lamina 198; and adhesive lamina 200. Release paper layer 202 is then applied to cover adhesive lamina 156.

Surface mount capacitors 204, 206 and 208, as best seen in FIGS. 18 and 19, are attached to adjoining conductive lamina preferably with the silver conductive adhesive disclosed herein to apply a selected capacitance across the same. Drops of conductive adhesive 210 conductively connect specific conductive lamina to specific contacts.

Specifically, surface mount capacitor 204 connects conductive laminas 190 and 192, surface mount capacitor 206 connects conductive laminas 192 and 194, and surface mount capacitor 208 connects conductive laminas 192 and 196. As seen in FIG. 17, elongate connecting portion 212 of conductive lamina 192 extends along the back of label 180 adjacent to conductive lamina 196 to facilitate connection thereto.

Surface mount capacitors 204, 206 and 208 preferably are Philips surface mount capacitors each respectively providing 2.1 pF, 8.5 pF and 2.1 pF of capacitance.

Substrate 186 is preferably constructed of 0.001 to 0.002 inch (0.0025–0.0051 cm) thick layer of polyimide material, for example, Dupont's Kapton™ polyimide.

Conductive laminas 188, 190, 192, 194, and 196 are printed 0.001 inch (0.0025 cm) thick layers of conductive silver ink, for example, Dupont's "5007" silver ink or Colonial's "E8205" silver ink. Conductive laminas 188, 190, 192, 194, and 196 can also be formed of conductive metal foils, such as a 0.002 inch (0.0051 cm) thick copper foil.

Printed dielectric 198 is a layer of 0.0018 inch (0.0046 cm) thick polymeric dielectric, for example DuPont's "5014D" polymeric dielectric or Minico's "M-UVF-10G" ultraviolet polymer solder mask.

Liquid adhesive drops 210 are preferably liquid drops of silver filled epoxy adhesive, which cures at room temperature, one example being Emerson and Cuming's Amicon™ CSM 933-65-1 adhesive.

FIG. 19 depicts label 180 of FIG. 17, with release paper 202 removed, ready for application to contacts 56 of the connector.

Additional embodiments of the present invention, as seen in FIGS. 20–26, include a printed circuit board capacitor label 220 applied to conductive traces 222 of a printed circuit board 224 which are conductively connected to contacts 226 of a modular jack printed circuit board communication connector 228 and a printed circuit board punch-down block connector 230 mounted on opposite sides of a printed circuit board 224.

Capacitor label 220 can be constructed of the same materials and in the same manner as describe above.

Figure 21:
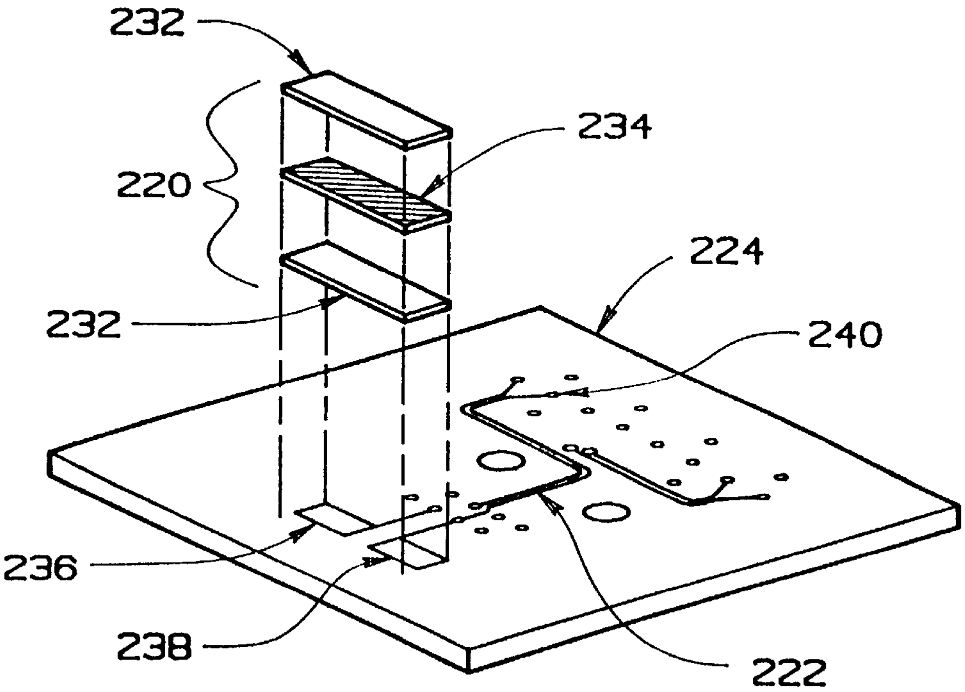
FIG. 21 is an exploded assembly perspective view of a no-point of contact printed circuit board capacitor label of FIG. 20.
Figure 22:
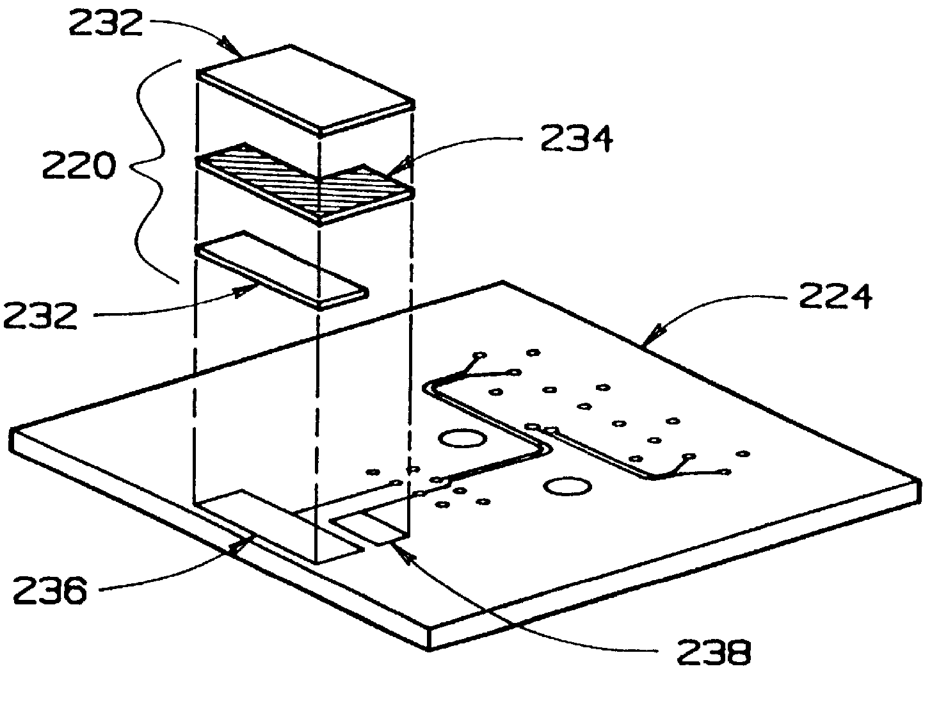
FIG. 22 is an exploded assembly perspective view of an alternative design single point of contact printed circuit board capacitor label.
Figure 23:
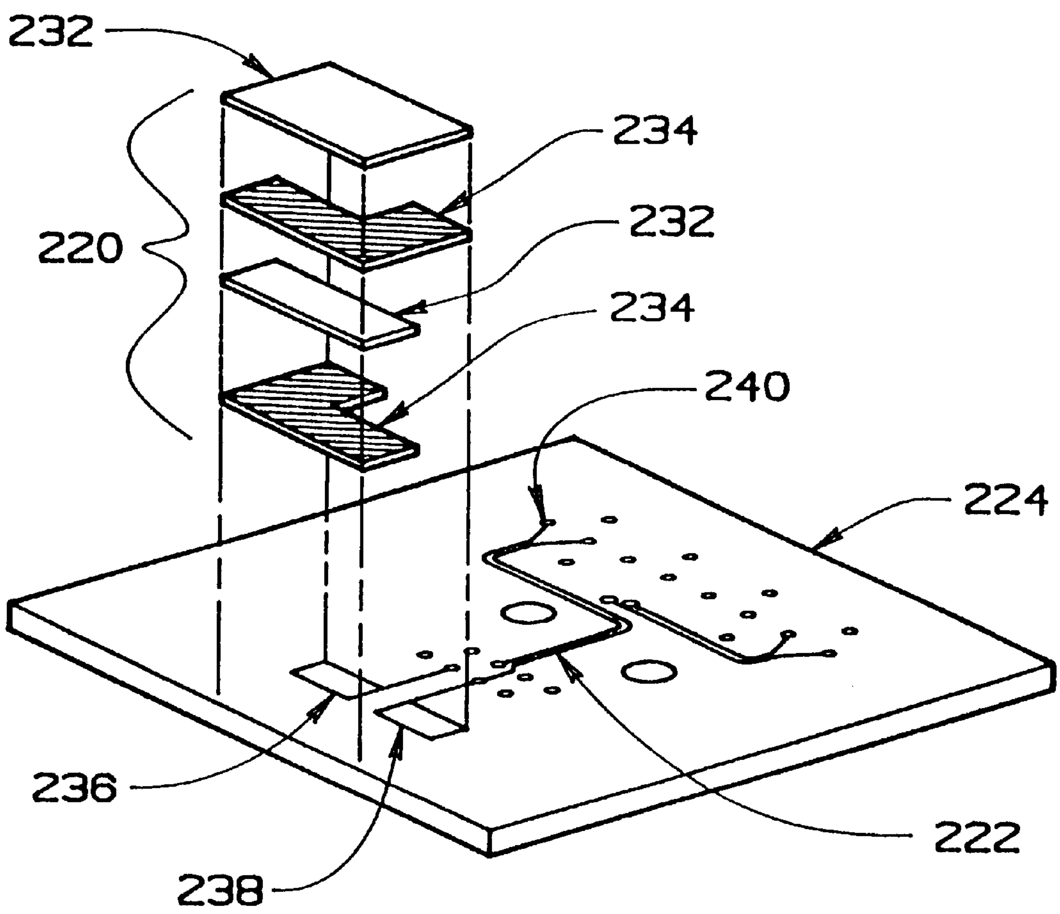
FIG. 23 is an exploded assembly perspective view of an alternative design two point of contact printed circuit board capacitor label.

As seen in FIGS. 21–23, insulating layers 232 and conductive layers 234 of label 220 can be positioned relative to first and second conductive pads 236 and 238 to provide capacitance between pads 236 and 238 and thus between contacts 226 through connected conductive traces 222 and contact passage 240.

FIG. 21 depicts a no-point of contact version of label 220 which extends across pads 236 and 238 without conductively touching the same. FIG. 22 depicts a single point of contact version of label 220 where conductive layer 234 makes conductive contact only with second conductive pad 238. FIG. 23 depicts a version of label 220 where the lower conductive layer 234 only makes conductive contact with first conductive pad 236 and the upper conductive layer 234 only makes conductive contact with second conductive pad 238.

Figure 24:
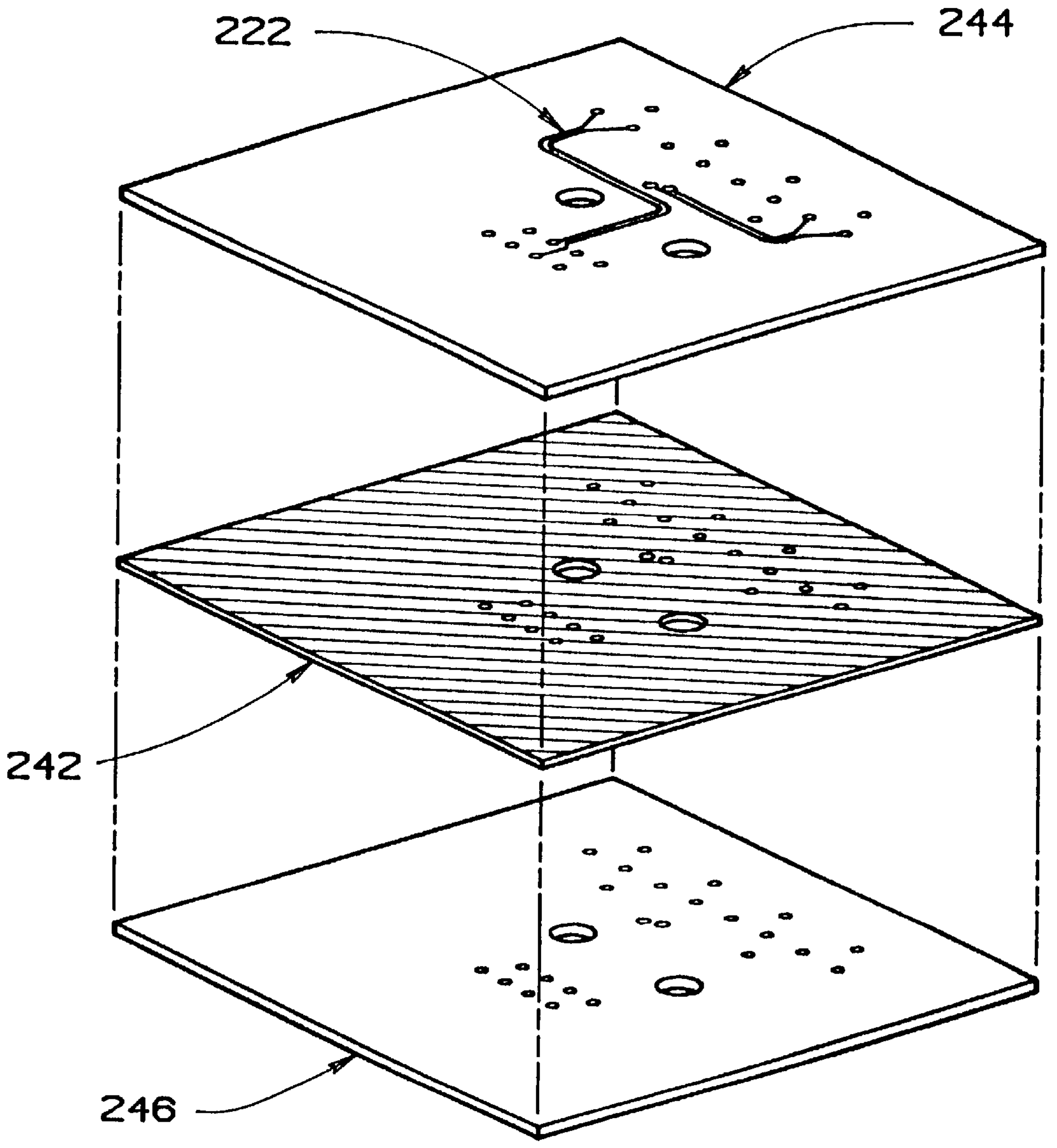
FIG. 24 is an exploded assembly perspective view of a printed circuit board having a conductive lamina disposed between upper and lower circuit boards having traces only on outer surfaces.
Figure 25:
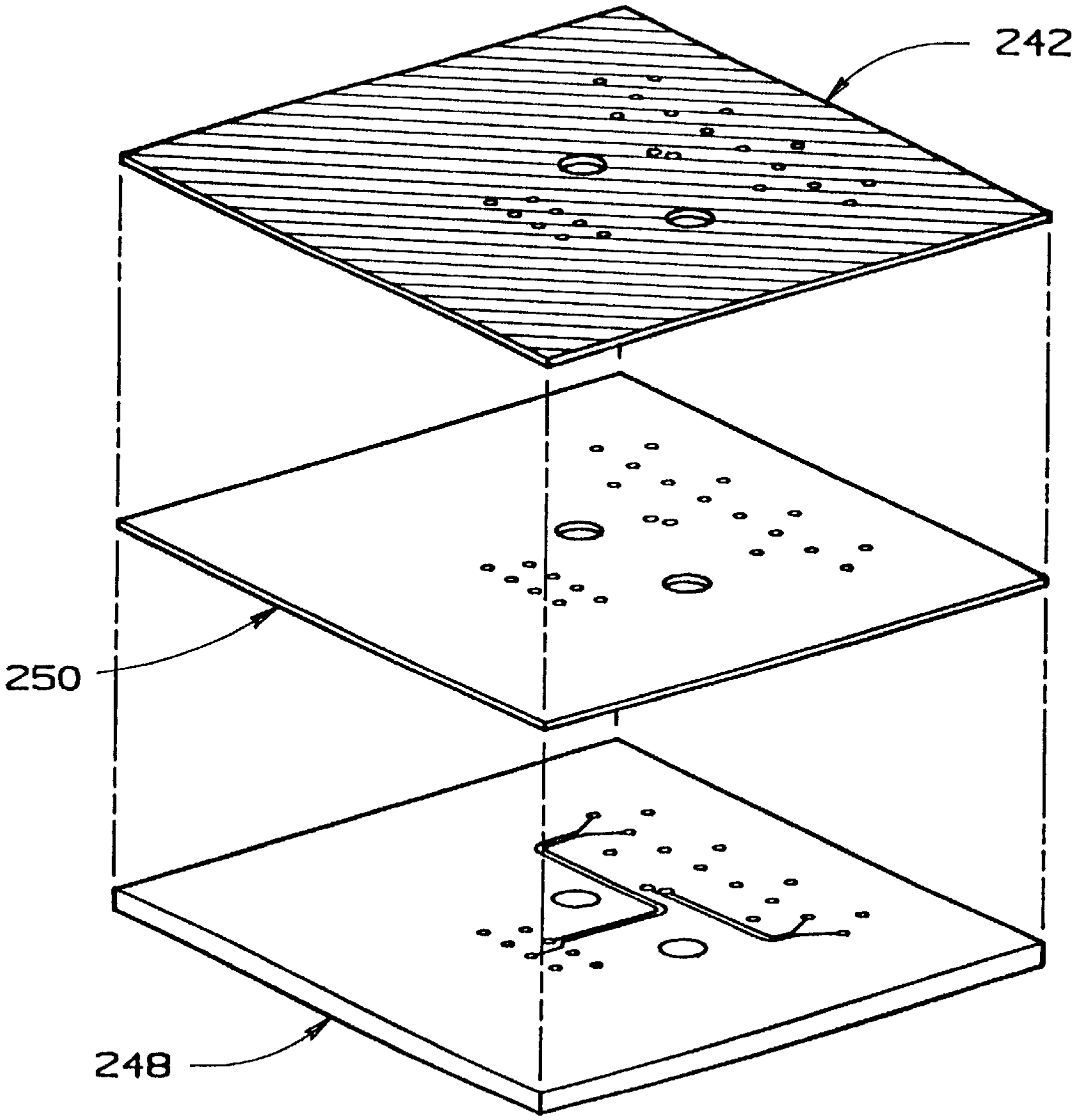
FIG. 25 is an exploded assembly perspective view of a lower printed circuit board having traces on both sides of the board separated from a conductive lamina by an insulating layer.
Figure 26:
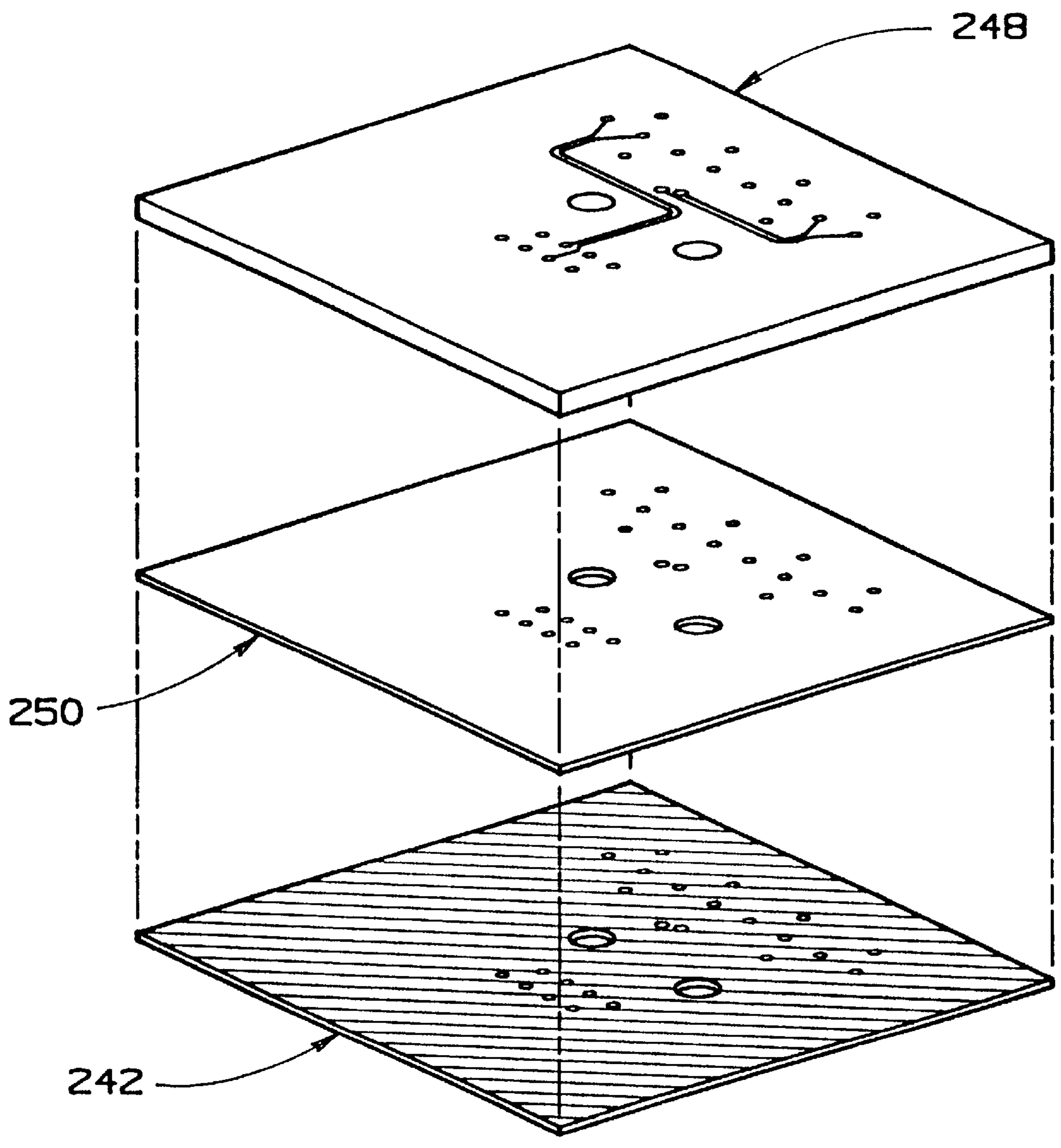
FIG. 26 is an exploded assembly perspective view of an upper printed circuit board having traces on both sides of the board separated from a conductive lamina by an insulating layer.

As seen in FIGS. 24–26, a standard printed circuit board 224 is preferably constructed with a conductive lamina 242 disposed between connectors 228 and 230, closely adjacent to traces 222 of printed circuit board. Conductive lamina 242, can be formed of a layer of silver conductive ink or metal foil as described above.

FIG. 24 discloses conductive lamina 242 disposed between a printed circuit board 244 that only has conductive traces 222 on its top surface and printed circuit board 246 that only has conductive traces (not shown) on its bottom surface, such that the insulating inner surfaces of printed circuit boards 244 and 246 act as a dielectric between conductive lamina 242 and traces 222.

FIGS. 25 and 26 each disclose a printed circuit board 248 that has conductive traces on each side of board 248 which are spaced from conductive lamina 242 by an insulating layer 250.

Insulating layer 250 is preferably constructed of a thin layer of Dupont's Kapton™ or similar material.

Figure 27:
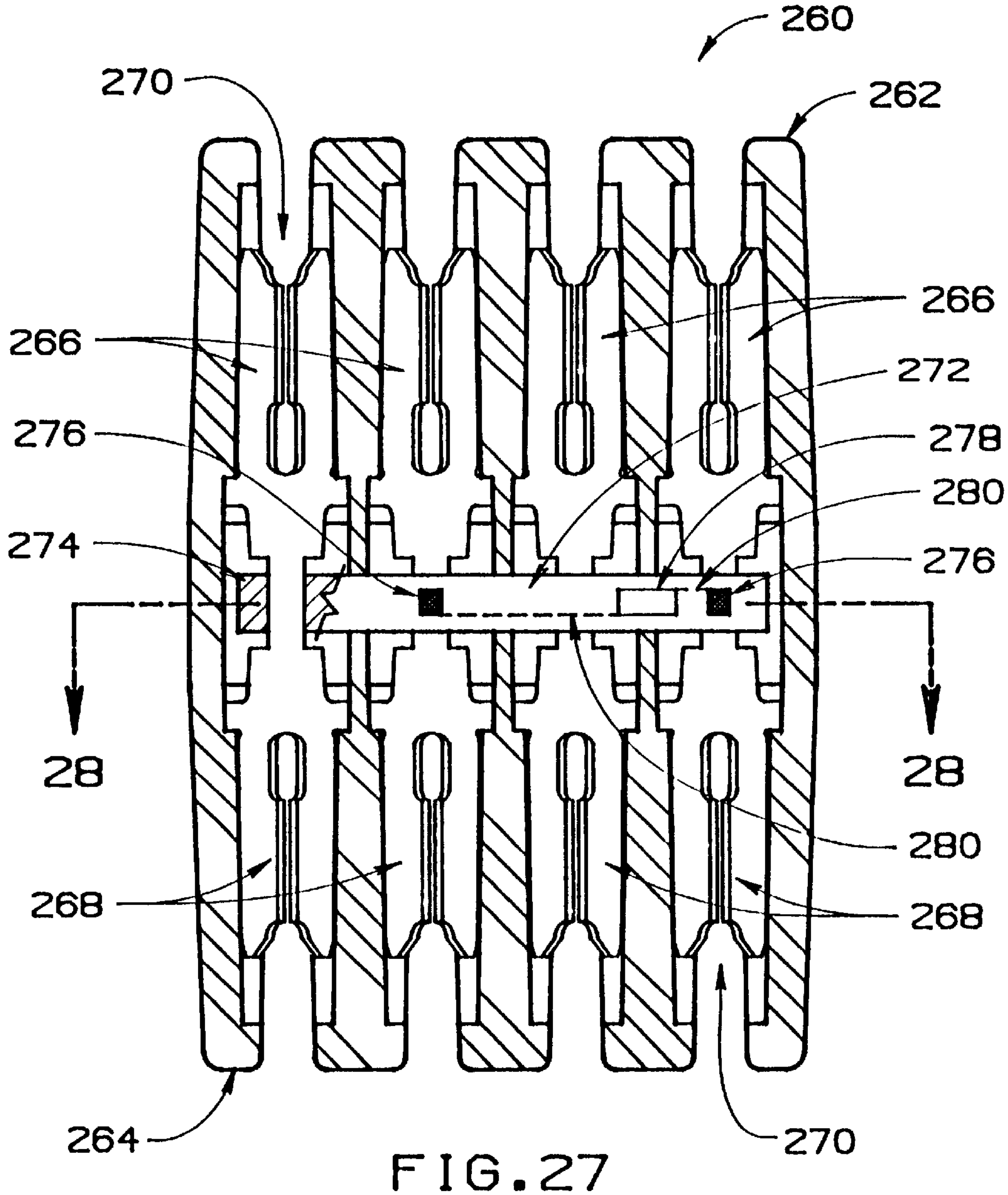
FIG. 27 is a sectional view of an alternative embodiment of a capacitor label strip and a punch-down connector embodying the concept of the present invention.
Figure 28:
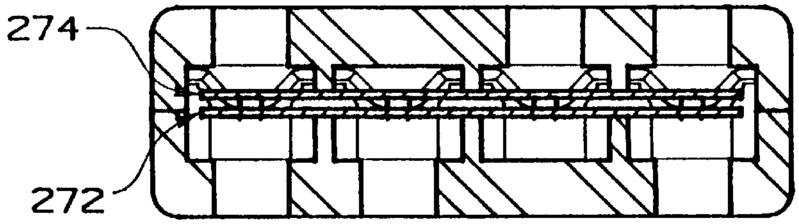
FIG. 28 is a sectional view taken along line 28—28 of FIG. 27.

Another embodiment of the present invention, as seen in FIGS. 27 and 28, includes a punch-down block connector 260 having an insulating plastic housing including upper and lower portions 262 and 264, insulation displacement contacts each having upper and lower metal insulation displacement contact portions 266 and 268 with each having insulation displacement slots 270 for terminating communication wires (not shown) a capacitor label strip 272 and a conductive lamina strip 274.

Punch-down block 260 is constructed to terminate individual wires of twisted wire pairs of communication cables. Typically, each wire of a twisted pair is terminated to adjacent contacts.

Although block 260 is illustrated having both upper and lower housing portions 262 and 264, a housing mounting a single row of contacts each of which includes a circuit board mounting post projecting from the housing for connection to a printed circuit board is also within the concept of the present invention.

A capacitor label strip 272 and conductive lamina strip 274 are disposed closely adjacent to opposite sides of a medial portion of the contacts.

Conductive lamina strip 274 preferably comprises a silver ink or a metal foil lamina respectively printed or adhesively secured between insulating layers.

Capacitor label strip 272 can be constructed in a like manner to the capacitor labels described above to electrically and capacitively couple every other contact. Capacitor label strip 272 may be conductively attached to one, both or none of the coupled contacts in the manner described above, the preferred method conductively joining conductive laminas of label strip 272 to every other contact with liquid conductive adhesive.

Twisted wire pairs can be terminated to adjacent contacts such that capacitively coupling every other contact capacitively couples a contact of one contact pair to a contact of a second contact pair.

As shown schematically in FIG. 27, in the preferred arrangement the contact conductive laminas of capacitor label strip 272 are positioned at zones 276 and are conductively attached to every other contact by conductive adhesive. Overlapping capacitor conductive laminas separated by a dielectric are positioned at a capacitor zone 278 and are connected to the contact conductive laminas at zones 276 by conductive traces positioned along dotted lines 280.

Figure 29:
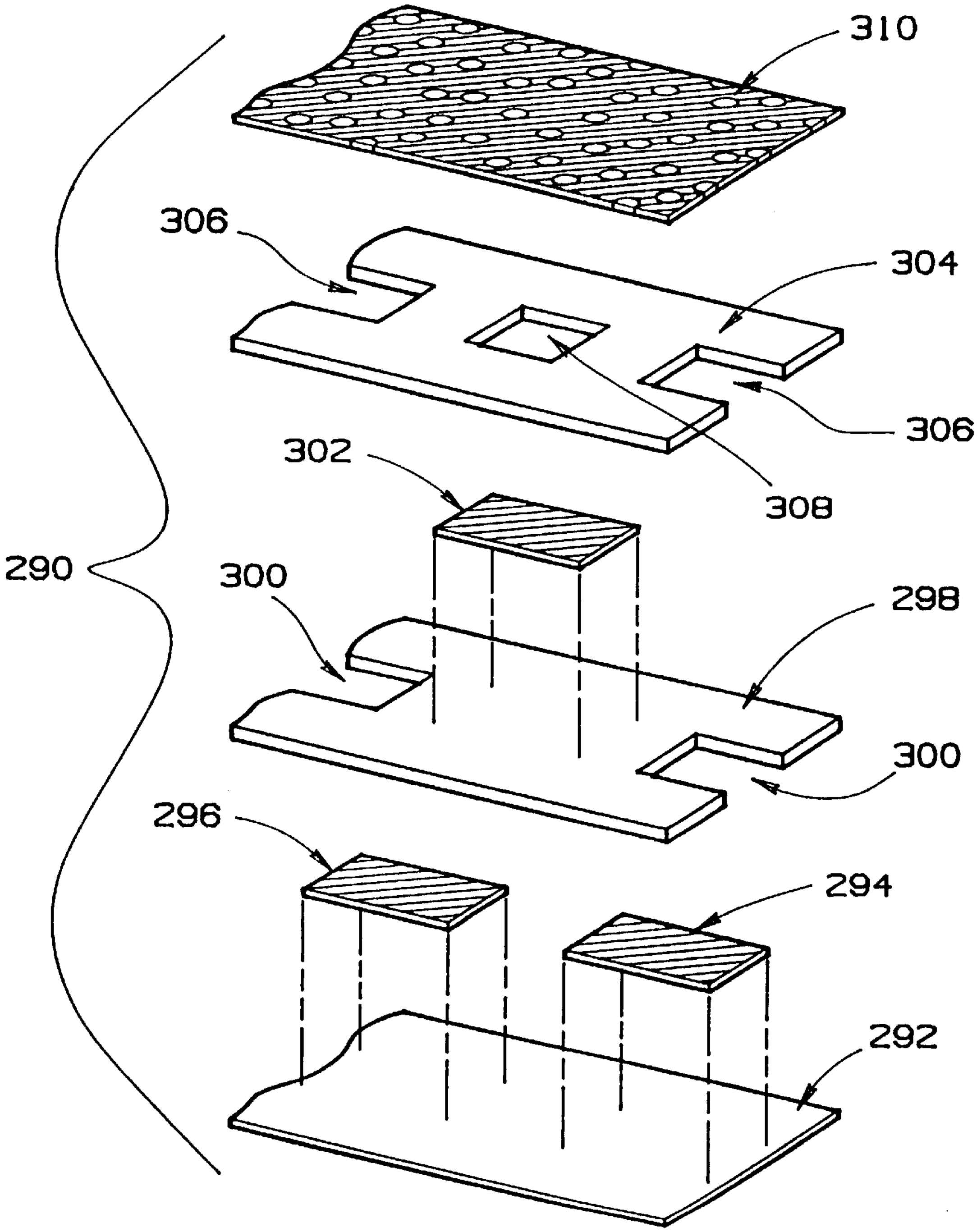
FIG. 29 is an exploded assembly perspective view of an alternative embodiment of a capacitor label strip for use with a punch-down connector having more than two contact pairs.

FIG. 29 illustrates in more detail the construction of a capacitor label strip 290 which is one of the possible designs of capacitor label strip 272 of FIGS. 26 and 27. Capacitor label strip 290 is used in the same manner and for the same purpose as capacitor label strip 272 of FIGS. 27 and 28. FIG. 29 illustrates a portion of a capacitor label strip that is designed to capacitively couple every other contact of three pair of adjacent contacts. The portion of the strip of FIG. 29 may be repeated to provide a capacitor label strip that can capacitively couple any number of contact pairs.

Strip 290 includes a Kapton™ insulating layer 292 upon which are printed a C1 conductive lamina 294 and a C5 conductive lamina 296; a printed dielectric lamina 298 having marginally disposed access notches 300; a C3 printed conductive lamina 302; and a printed insulating lamina 304 having marginally disposed access notches 306 and medially disposed access window 308. A layer of 3M's Scotch™ 9703 anisotropic conductive adhesive transfer tape 310 is adhesively secured to insulating lamina 304 and, through aligned access notches 300 and 306 and access window 308, to C1, C3 and C5 conductive laminas 294, 302 and 296.

Capacitor label strip 290 is aligned with and adhesively secured to the contacts of the contact row such that every other contact is aligned with a respective portion of conductive tape 310 that is in conductive contact with a respective one of conductive laminas 294, 302 and 296. Since tape 310 only conducts electricity through its thickness and not along the plane of the tape, every other contact is only conductively connected to a respective conductive lamina 294, 302 or 296 and thus every other contact is capacitively coupled to the next closest contact by overlapping portions of conductive laminas 294, 302 and 296. The preferred and alternative materials and construction methods for capacitor label strip 290 are the same as the materials and construction methods of the above described capacitor labels.

While the particular preferred embodiments of the present invention have been described, it will be obvious to those skilled in the art that changes and modifications may be made without departing from the teachings of the invention.

We claim:

1. A capacitor label for a communication connector having a plurality of contact pairs disposed in a substantially parallel array for conductive connection to respective communication signal wire pairs, comprising:

capacitor means formed on the capacitor label for capacitively coupling a first contact of one contact pair to a second contact of a second contact pair; and a common conductive lamina disposed closely adjacent to an outer insulating surface of the capacitor label, the common conductive lamina being of sufficient extent to extend across and along the contact array of the contact pairs such that crosstalk is reduced between the contact pairs.

2. A capacitor label as set forth in claim 1, wherein the capacitor means includes a multilayer label having first and second spaced apart conductive lamina separated by a dielectric and wherein the first conductive lamina is conductively joined to the first contact and the second conductive lamina is conductively joined to the second contact.

3. A capacitor label as set forth in claim 2, including conductive adhesive means for joining each of the first and second contacts to each respective first and second conductive lamina.

4. A capacitor label as set forth in claim 3, wherein the common and first and second conductive laminas are printed layers of conductive silver ink and the dielectric is a printed insulating lamina.

5. A capacitor label as set forth in claim 4, wherein the capacitor label includes an outer adhesive surface for securing the label to the contacts.

6. A capacitor label as set forth in claim 2, wherein the common conductive lamina is a metal foil.

7. A capacitor label as set forth in claim 1, wherein the capacitor means includes a multilayer label having a first conductive lamina separated from the contacts by a dielectric with the first conductive lamina being conductively joined to the first contact and the first conductive lamina including an elongate portion that extends along a portion of the second contact a distance sufficient to capacitively couple the first conductive lamina to the second contact.

8. A capacitor label as set forth in claim 7, including conductive adhesive means for joining the one contact to the first conductive lamina.

9. A capacitor label as set forth in claim 8, wherein the common and the first conductive laminas are printed layers of conductive silver ink and the dielectric is a printed insulating lamina.

10. A capacitor label as set forth in claim 9, wherein the capacitor label includes an outer adhesive surface for securing the label to the contacts.

11. A capacitor label as set forth in claim 7, wherein the common conductive lamina is a metal foil.

12. A capacitor label as set forth in claim 1, wherein the capacitor means includes a capacitor label having a first conductive lamina separated from the contacts by a dielectric and the first conductive lamina including elongate portions that extend along portions of the first and second contacts a distance sufficient to capacitively couple the first conductive lamina to each of the first and second contacts.

13. A capacitor label as set forth in claim 12, wherein the common and the first conductive laminas are printed layers of conductive silver ink.

14. A capacitor label as set forth in claim 13, wherein the capacitor label includes an outer adhesive surface for securing the label to the contacts.

15. A capacitor label as set forth in claim 12, wherein the common conductive lamina is a metal foil.

16. A capacitor label as set forth in claim 1, wherein the capacitor means includes a label having a surface mount capacitor electrically connected between first and second conductive lamina wherein the first conductive lamina is conductively joined to the first contact and the second conductive lamina is conductively joined to the second contact.

17. A capacitor label as set forth in claim 16, including conductive adhesive means for joining the first and second contact to each respective first and second conductive lamina.

18. A capacitor label as set forth in claim 17, wherein the common and first and second conductive laminas are layers of printed conductive silver ink and the dielectric is a printed insulating lamina.

19. A capacitor label as set forth in claim 18, wherein the capacitor label includes an outer adhesive surface for securing the label to the contacts.

20. A capacitor label as set forth in claim 16, wherein the common conductive lamina is a metal foil.

* * * * *